US012550704B2

(12) United States Patent
Lanzillo et al.

(10) Patent No.: US 12,550,704 B2
(45) Date of Patent: Feb. 10, 2026

(54) SUBTRACTIVE SKIP VIA

(71) Applicant: INTERNATIONAL BUSINESS MACHINES CORPORATION, Armonk, NY (US)

(72) Inventors: Nicholas Anthony Lanzillo, Wynantskill, NY (US); Koichi Motoyama, Clifton Park, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 18/057,380

(22) Filed: Nov. 21, 2022

(65) Prior Publication Data
US 2024/0170404 A1 May 23, 2024

(51) Int. Cl.
| | | |
|---|---|---|
| H01L 23/535 | (2006.01) | |
| H01L 21/768 | (2006.01) | |
| H01L 23/522 | (2006.01) | |
| H01L 23/528 | (2006.01) | |
| H01L 23/532 | (2006.01) | |

(52) U.S. Cl.
CPC ...... *H01L 23/535* (2013.01); *H01L 21/76805* (2013.01); *H01L 21/76895* (2013.01); *H01L 23/5226* (2013.01)

(58) Field of Classification Search
CPC ............ H01L 23/535; H01L 21/76805; H01L 21/76895; H01L 23/5226; H01L 21/76885; H01L 23/53295; H01L 23/5283
See application file for complete search history.

(56) References Cited

U.S. PATENT DOCUMENTS

| | | |
|---|---|---|
| 9,148,963 B2 | 9/2015 | Matsuda |
| 9,805,972 B1 | 10/2017 | Zhang |
| 10,020,255 B1 | 7/2018 | Bao |
| 10,026,687 B1 | 7/2018 | Lin |
| 10,083,905 B2 | 9/2018 | Briggs |
| 10,109,526 B1 | 10/2018 | Zhang |
| 10,283,407 B2 | 5/2019 | Chi |
| 11,315,799 B2 | 4/2022 | Xie |
| 2020/0135640 A1* | 4/2020 | Sio ............ H01L 23/5226 |
| 2021/0375637 A1 | 12/2021 | Parikh |
| 2022/0108921 A1 | 4/2022 | Bae |
| 2022/0384311 A1* | 12/2022 | Oh ............ H10D 84/038 |

FOREIGN PATENT DOCUMENTS

CN 106793507 A 5/2017

* cited by examiner

*Primary Examiner* — Herve-Louis Y Assouman
(74) *Attorney, Agent, or Firm* — Kelsey M. Skodje

(57) ABSTRACT

A semiconductor device includes a subtractive skip via technique in which a relatively high aspect ratio (HAR) skip via is fabricated within a lower aspect ratio (LAR) skip via opening. A metal fill is formed within the LAR skip via opening. Undesired portions of the metal fill region are removed, a retained portion or portion thereof forms the HAR skip via, and/or retained portions thereof forms multiple HAR skip vias, or the like. After forming these substrative via(s), a dielectric backfill may be formed therearound within the remaining LAR skip via opening. This backfill dielectric may be selected to reduce shorting propensities between the substrative via(s) and respective one or more wiring structures in a lower level, in a higher level, and/or the skipped level(s).

20 Claims, 29 Drawing Sheets

SUBTRACTIVE SKIP VIA

BACKGROUND

The present disclosure relates to fabrication methods and resulting structures for semiconductor devices. More specifically, the present disclosure relates to fabrication methods and resulting structures for IC devices, such as wafers, dies, processors, etc. that include a subtractive super or skip vertical interconnect access (via).

A via is an electrical connection between wiring structures (e.g., wiring traces within different layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

In via technology, a super via, also known as a skip via, can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

SUMMARY

In an embodiment of the present disclosure, a semiconductor device includes a first wiring layer, a second wiring layer, a third wiring layer, a subtractive skip via, and dielectric fill. The first wiring layer includes a bottom wiring structure. The second wiring layer is above the first wiring layer and includes a second wiring layer insulator. The third wiring layer is above the second wiring layer and includes a top wiring structure within a third wiring layer insulator. The subtractive skip via that connects the bottom wiring structure and the top wiring structure. The dielectric fill is around a side perimeter of the subtractive skip via.

In another embodiment of the present disclosure, a semiconductor device includes a first wiring layer, a second wiring layer, a third wiring layer, a subtractive skip via, and dielectric fill. The first wiring layer that includes a bottom wiring structure. The second wiring layer is above the first wiring layer and includes a second wiring layer insulator. The third wiring layer is above the second wiring layer and includes a top wiring structure within a third wiring layer insulator. The subtractive skip via connects the bottom wiring structure and the top wiring structure. The dielectric fill is around a side permitter of the subtractive skip via and between the second wiring layer insulator and the third wiring layer insulator.

In another embodiment of the present disclosure, a semiconductor device includes a first wiring layer, a second wiring layer, a third wiring layer, a dual subtractive skip via, and dielectric fill. The first wiring layer that includes a first bottom wiring structure and a second bottom wiring structure. The second wiring layer is above the first wiring layer and includes a second wiring layer insulator. The third wiring layer is above the second wiring layer and includes a third wiring layer insulator, a first top wiring structure within the third wiring layer insulator, and a second top wiring structure within the third wiring layer insulator. The dual subtractive skip via includes a first subtractive skip via that connects the first bottom wiring structure and the first top wiring structure and a second subtractive skip via that connects the second bottom wiring structure and the second top wiring structure. The dielectric fill is between the first subtractive skip via and the second subtractive skip via.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1C:
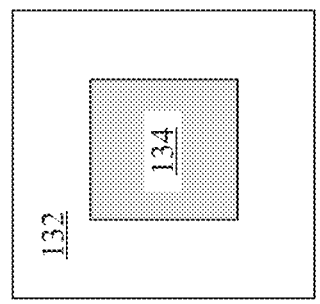
FIG. 1B and FIG. 1C depicts different orthogonal cross-sectional views of the subtractive skip via of FIG. 1A, according to embodiments of the disclosure.

There are challenges to traditional skip vias techniques. For example, in typical manufacturing process, the skip via will need to land on a wiring structure in a lower level (e.g., M0 level), while the regular via will need to land on the wiring structure in an upper level (e.g., M1 or above level). Also, in traditional skip via processes, complex high aspect ratio (HAR) etch or multiple HAR etch stages, also known as deep silicon etch, deep trench silicon etch, silicon deep reactive ion etch (DRIE), and high aspect ratio trench (HART) silicon etch, or the like may be needed to form the HAR deep trench associated with the skip via through various dielectric layers (such as a silicon layer between upper and lower dielectric cap layers, etc.). Subsequently, conventional copper plating process has been typically used to fill the vias. The copper plating process, though, grows from all directions including the sidewalls and bottom of the via resulting in extensive voids created due to pinch-off from sidewall growth and bottom voids from insufficient physical vapor deposition (PVD) seed coverage within the HAR deep trench. Voids can also result from the undercut profile formed by ultra-low k (ULK) plasma-induced-damage (PID) or cap-to-interlevel dielectric selectivity. Also, the liner/seed may not be sufficient to cover the full length within the HAR deep trench, also resulting in void formation. These voids negatively affect the resistivity of the skip vias which, in turn, decreases device performance.

Aspects of the disclosure may improve or eliminate these issues that may arise from using skip vias. For example, embodiments of the disclosure provide for wiring structures that are connected by a subtractive super (skip) via and methods of manufacture. More specifically, the present disclosure describes a subtractive skip via integration technique that does not rely upon a HAR deep etch process nor a HAR deep conductive fill. Rather, embodiments of the present disclosure provide for a relatively large metal fill region formed within a relatively low aspect ratio (LAR) skip via opening relative to a high aspect ratio (HAR) of the subtractive skip via formed therein. Undesired portions of the metal fill region are removed, a retained portion thereof forms the subtractive skip via, and/or retained portions thereof forms multiple subtractive skip vias, or the like. After the substrative via(s) formation, a dielectric backfill may be formed therearound. This backfill dielectric may be selected to reduce shorting propensities between the substrative via(s) and the wiring structure/contact in the lower-level and the wiring structure in the higher-level. Further the backfill dielectric may increase subsequent etch selectivity control. For example, trench formation of the higher-level wiring structure may use the backfill dielectric as an etch stop. In certain implementations, the disclosed subtractive skip vias may provide for reduced skip via to skip via pitch or spacing relative to traditional skip via integrations.

The wiring structures and subtractive etch via of the present disclosure can be manufactured in a number of ways using a number of different tools. In general, though, the methodologies and tools are used to form structures with dimensions in the micrometer and nanometer scale. The methodologies, i.e., technologies, employed to manufacture the wiring structures and subtractive etch via of the present disclosure have been adopted from integrated circuit (IC) technology. For example, the structures are built on wafers and are realized in films of material patterned by photolithographic processes on the top of a wafer. In particular, the fabrication of the wiring structures and subtractive etch via uses three basic building blocks: (i) deposition of material(s) on a substrate, (ii) applying a patterned mask on top of the material(s) by photolithographic imaging, and (iii) etching the material(s) selectively to the mask.

The flowcharts and cross-sectional diagrams in the drawings illustrate methods of fabricating IC devices that include a subtractive etch via, according to various embodiments of the disclosure. In some alternative implementations, the fabrication steps may occur in a different order that that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and/or IC fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a semiconductor device, such as a micro-chip, that will be packaged into an IC fall into four general categories, namely, material deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Materials of both conductors (e.g., poly-silicon, aluminum, copper, etc.) and insulators (e.g., various forms of silicon dioxide, silicon nitride, etc.) are used to connect and isolate other wiring or device components. Semiconductor lithography is the formation of three-dimensional relief images or patterns in the underlying material(s) for subsequent transfer of the pattern to the material(s). In semiconductor lithography, the patterns are formed by a light sensitive polymer called a photo-resist.

Figure 1B:
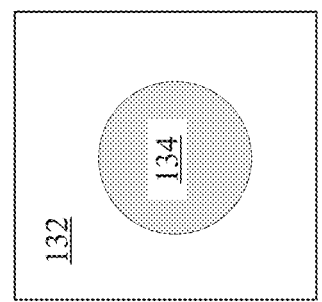
Figure 1A:
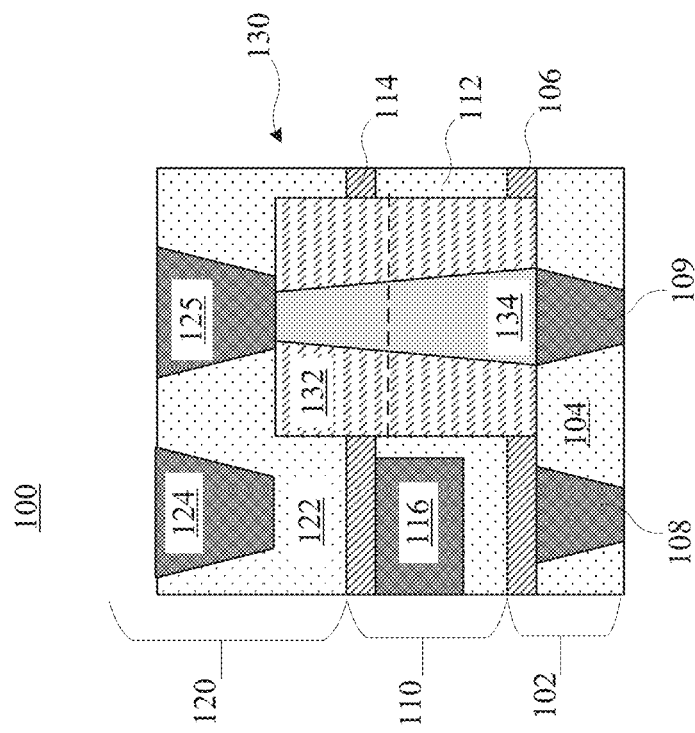
FIG. 1A depicts a cross-sectional view of a semiconductor device that includes a subtractive skip via, according to embodiments of the disclosure.

Referring now to the drawings in which like numerals represent the same or similar elements and initially to FIG. 1A which depicts a cross-sectional view of a semiconductor device 100 that includes a subtractive skip via 130, according to embodiments of the disclosure.

In embodiments, the semiconductor device 100 can be a back end of the line (BEOL) or middle of the line (MOL) structure. In particular, the semiconductor device 100 includes a plurality of wiring levels, e.g., $M_a$ level 102, $M_b$ level 110, $M_c$ level 120, etc., in an IC device, such as a microprocessor, die, wafer, or the like. For example, the semiconductor device 100 includes wiring structures 108, 109 provided in an insulator 104 in $M_a$ level 102. For clarity, the wiring structures 108, 109 are lower wiring structures, designated representatively at a lower level (e.g., M1 level for BEOL), or CA/CB level for MOL, although the wiring structures 108, 109 can be provided at any lower level of the semiconductor device 100. When wiring structures 108, 109 are in the CA/CB level for MOL, then wiring structure 116 is a relatively higher wiring level (e.g., M0 level for BEOL).

In embodiments, the insulator 104 is an oxide-based material (e.g., $SiO_2$ or the like), e.g., interlevel dielectric (ILD) material, which can be deposited by a deposition method, e.g., chemical vapor deposition (CVD). The insulator 104 can also be an ultra low-k dielectric material (a material with a lower dielectric constant relative to $SiO_2$), a carbon doped insulator material or other insulator material with porosity.

The wiring structures 108, 109 can be formed by lithography, etching, and deposition methods. For example, a resist formed over the insulator 104 is exposed to energy (light) to form a pattern (opening). An etching process with a selective chemistry, e.g., reactive ion etching (RIE), will be used to form one or more trenches in the insulator 104 through the openings of the resist. The resist can then be removed by a conventional oxygen ashing process or other known stripants. Following the resist removal, conductive material can be deposited in the one or more trenches by any conventional deposition processes, e.g., chemical vapor deposition (CVD) processes. The wiring structures 108, 109 can be composed of any conductive material such as, e.g., copper, tungsten, cobalt, nickel, aluminum, ruthenium etc. In a particular implementation, the wiring structures 108, 109 are composed of copper. The wiring structures 108, 109 can also be lined with Ti, Ta, TiN, TaN, ruthenium, cobalt, etc. Any residual conductive material on the surface of the insulator 104 can be removed by conventional chemical mechanical polishing (CMP) processes.

Following the CMP process, a capping layer 106 is deposited on the wiring structures 108, 109 and insulator 104. In embodiments, the capping layer 106 can be a diffusion barrier layer, e.g., copper diffusion barrier layer, which prevents copper or other metallization diffusion to an insulator 112 as well as preventing oxygen diffusion to the wiring structures 108, 109.

Next, a higher $M_b$ level 110 is formed. $M_b$ level 110 may be formed with similar techniques relative to the $M_a$ level 102 and may include wiring structure 116 and via interconnect structures (not shown) within the insulator 112. In embodiments, the wiring structure 116 and the via interconnect structures can be formed in any wiring layer above that of the wiring structures 108, 109.

For clarity, the wiring structure 116 may be upper wiring structures, designated at an M1, M2, etc. level; whereas the via interconnect structures (not shown) are upper via interconnect structures designated at V0, V1, etc. level. These via interconnect structures may connect the wiring structure 116 with the wiring structure 108, or the like.

The wiring structure 116 and the via interconnect structures (not shown) can be formed using conventional lithography, etching, and deposition processes, similar to that which was discussed with respect to the formation of the wiring structures 108, 109. The wiring structure 116 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 112, a capping layer 114 is formed on the wiring structure 116 and insulator 112. In embodiments, the capping layer 114 can be a diffusion barrier layer, e.g., copper diffusion barrier layer, as described above, the insulator 112 can be any insulator material as described above.

Next, one or more portions of a higher $M_c$ level 120 is formed. $M_c$ level 120 may be formed with similar techniques relative to the below level(s) and may include wiring structures 124, 125 and via interconnect structures (not shown) within an insulator 122. In embodiments, the wiring structures 124, 125 and the via interconnect structures can be formed in any wiring layer above that of the wiring structure 116.

For clarity, the wiring structures 124, 125 may be upper wiring structures, designated at an M2, M3, etc. level; whereas the via interconnect structures (not shown) are upper via interconnect structures designated at V1, V2, etc. level. These via interconnect structures may connect the wiring structure 124 with the wiring structure 116, or the like.

The wiring structures 124, 125 and the via interconnect structures (not shown) can be formed using conventional lithography, etching, and deposition processes, similar to that which was discussed with respect to the formation of the wiring structures 108, 109, and/or 116. The wiring structures 124, 125 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 122, a capping layer (not shown) may be formed on the wiring structures 124, 125 and insulator 122. In embodiments, the capping layer (not shown) can be a diffusion barrier layer, e.g., copper diffusion barrier layer, as described above, the insulator 122 can be any insulator material as described above.

Semiconductor device 100 further includes a subtractive skip via 130 that connects the wiring structure 125 within $M_c$ level 120 to the wiring structure 109 within $M_a$ level 102. For clarity, the subtractive skip via 130 does not contact with any wiring structure $M_b$ level 110 and thereby skips at least the $M_b$ level 110, as depicted. More specifically, the subtractive skip via 130 avoids electrical contact with wiring structure(s) in the $M_b$ level 110 or level(s) in which the subtractive skip via 130 is designed to skip. The subtractive skip via 130 include conductive skip via 134 surrounded by dielectric backfill 132. The subtractive skip via 130 may be formed by forming skip via opening within insulator 122, within capping layer 114, within insulator 112, and within capping layer 106. A conductive material may fill the skip via opening and may be subsequently patterned or shaped. Undesired portions of the metal fill region may be removed and a retained portion thereof forms the conductive skip via 134. After the conductive skip via 134 is formed, the dielectric backfill 132 may be formed therearound. This the dielectric backfill 132 material and geometry may be selected to reduce shorting propensities between the conductive skip via 134 and the wiring structures 108, 116, 124 that which the conductive skip via 134 is not intended to be connected. Further the dielectric backfill 132 may increase subsequent etch selectivity control and be used as an etch stop to form the trenches of wiring structures 124, 125. In certain implementations, the subtractive skip via 130 may provide for reduced skip via to skip via pitch or spacing relative to traditional skip via integrations. In certain examples, a top surface of dielectric backfill 132 may be above the bottom surface of insulator 122. In other words, dielectric backfill 132 may extend into $M_c$ level 120.

FIG. 1B and FIG. 1C depict different orthogonal cross-sectional views of the subtractive skip via 130, according to embodiments of the disclosure. For example, the dielectric backfill 132 may have a circular, rectangular, square (as depicted in both FIG. 1B and FIG. 1C) orthogonal cross-sectional view shape, though other shapes may be realized. Further, the dielectric backfill 132 may have a circular (as depicted in FIG. 1B), rectangular, square (as depicted in FIG. 1C) orthogonal cross-sectional view shapes, though other shapes may be realized. The orthogonal cross-sectional plane of FIG. 1B and FIG. 1C is depicted as a dashed line through the subtractive skip via 130 in FIG. 1A.

Figure 2:
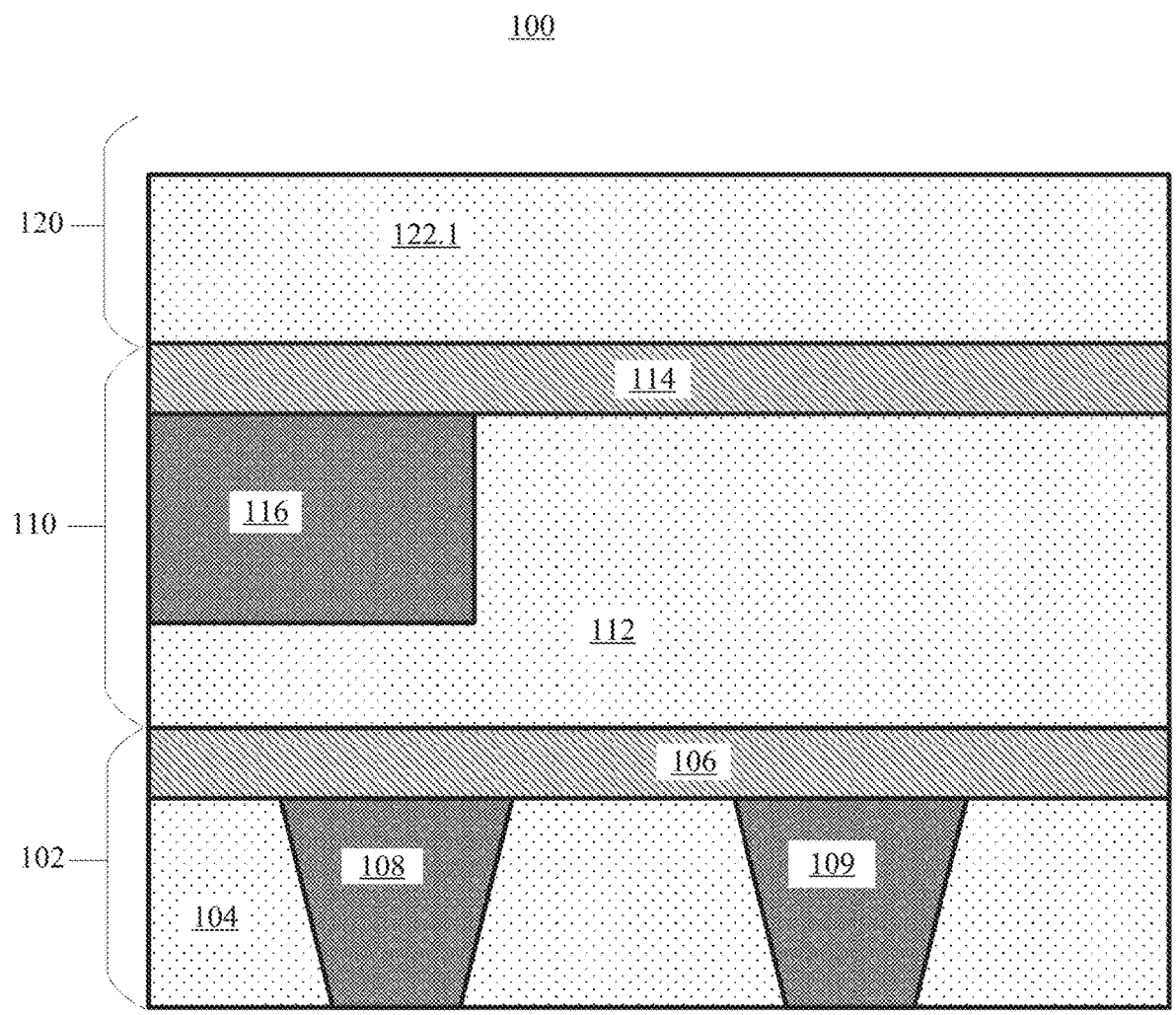
FIG. 2 through FIG. 9 depicts cross-sectional views of a semiconductor device that includes a subtractive skip via at stages of the semiconductor device fabrication process, according to embodiments of the disclosure.

FIG. 2 depicts a cross-sectional view of semiconductor device 100 that is to include the subtractive skip via 130 at an initial fabrication stage, according to embodiments of the disclosure.

Initially $M_a$ level 102 is formed upon an underlying IC device layer (not shown), such as a microprocessor layer, die layer, wafer layer, or the like. For example, insulator 104 is formed upon a device level, such as front end of the line (FEOL) layer, MOL layer, or the like. The insulator may be formed by depositing the oxide, the ultra low-k dielectric, the carbon doped insulator material, or other insulator material with porosity upon the underlying IC device layer (not shown).

Wiring structures 108, 109 may be formed in the insulator 104. The wiring structures 108, 109 can be formed by lithography, etching, and deposition methods. For example, a resist (not shown) formed over the insulator 104 is exposed to energy (e.g., light, etc.) to form a pattern (opening). An etching process with a selective chemistry, e.g., reactive ion etching (RIE), may be used to form one or more trenches in the insulator 104 through the openings of the resist. Such etching technique may result in sloped sidewalls, such that the width of the top of the trenches are greater than the width of the bottom of the trenches, as depicted. The resist can then be removed by a conventional oxygen ashing process or other known stripants.

Following the resist removal, wiring structures 108, 109 may be further fabricated by depositing conductive material in the one or more trenches by a deposition process, e.g., chemical vapor deposition (CVD) process, or the like. The wiring structures 108, 109 can be composed of any conductive material such as, e.g., copper, tungsten, cobalt, nickel, aluminum, ruthenium etc. In a particular implementation, the wiring structures 108, 109 are composed of copper. The wiring structures 108, 109 can also be lined with Ti, Ta, TiN, TaN, ruthenium, cobalt, etc. Any residual conductive material on the surface of the insulator 104 can be removed by a chemical mechanical polishing (CMP) process.

Following the CMP process, a capping layer 106 is deposited on the wiring structures 108, 109 and insulator 104. In embodiments, the capping layer 106 can be a diffusion barrier layer, e.g., copper diffusion barrier layer, which prevents copper or other metallization diffusion to an insulator 112 as well as preventing oxygen diffusion to the wiring structures 108, 109.

Next, the $M_b$ level 110 is formed. $M_b$ level 110 may be formed with similar techniques relative to the $M_a$ level 102 and may include wiring structure 116 and via interconnect structures (not shown) within the insulator 112. In embodiments, the wiring structure 116 and the via interconnect structures can be formed in any wiring layer above that of the wiring structures 108, 109.

For clarity, the wiring structure 116 may be an upper or higher wiring structure, designated at an M1, M2, etc. level; whereas the via interconnect structures (not shown) are upper via interconnect structures designated at V0, V1, etc. level. These via interconnect structures may connect the wiring structure 116 with the wiring structure 108, or the like.

The wiring structure 116 and the via interconnect structures (not shown) can be formed using conventional lithography, etching, and deposition processes, similar to that which was discussed with respect to the formation of the wiring structures 108, 109. The wiring structure 116 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 112, a capping layer 114 is formed on the wiring structure 116 and insulator 112. In embodiments, the capping layer 114 can be a diffusion barrier layer, e.g., copper diffusion barrier layer, as described above, the insulator 112 can be any insulator material as described above. Next, a first portion of $M_c$ level 120 is formed. $M_c$ level 120 may be partially formed by depositing a first insulator 122.1 that is a part of insulator 122 upon the capping layer 114.

Figure 3:
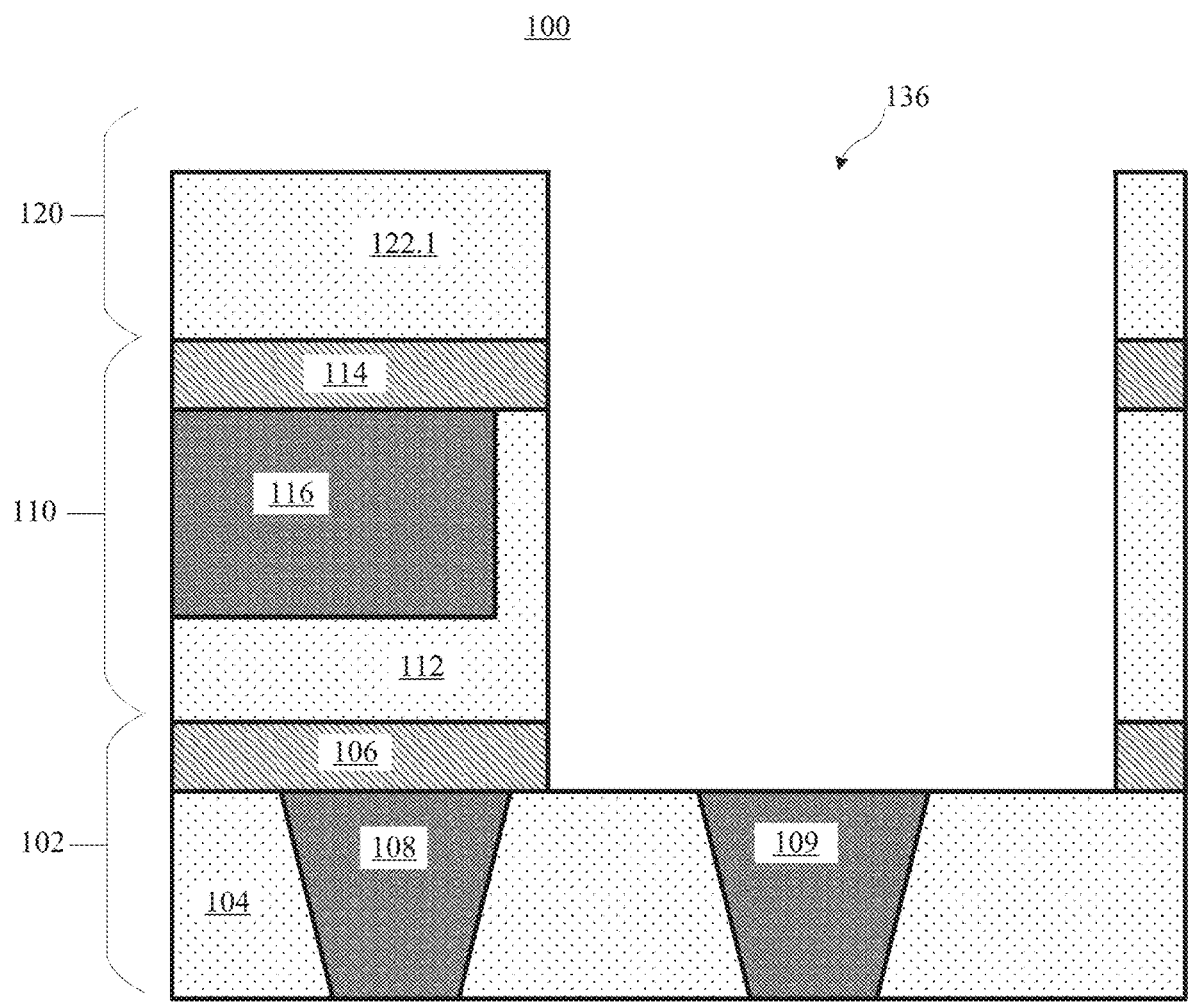

FIG. 3 depicts a cross-sectional view of semiconductor device 100 that is to include the subtractive skip via 130 at a subsequent fabrication stage, according to embodiments of the disclosure. At the present fabrication stage, a skip via opening is formed within capping layer 114, within insulator 112, and within capping layer 106.

The skip via opening can be formed using lithography and etching processes. For example, a masking material (not shown) is formed on the surface of the insulator 122.1. The masking material is patterned by lithography processes, e.g., a resist is formed on the masking material, which is exposed to energy (light) to form a pattern (openings) in alignment with a desired location or region of the subtractive skip via 130. Such location or region, as exemplary defined by the perimeter of the subtractive skip via 130 of FIG. 1B and FIG. 1C, has sufficient side to side dimension and/or front to rear dimension in relation to the height or depth of the skip via opening for the skip via opening to have a relatively higher aspect ratio compared to the conductive skip via 134 fabricated therewithin. Consistent therewith, skip via opening may be referred as a low aspect ratio (LAR) skip via opening, while the conductive skip via 134 fabricated therewithin may be referred as a high aspect ratio (HAR) subtractive skip via. As such, the HAR subtractive skip via may be achieved utilizing the LAR skip via opening.

An etching process, such as an antitropic etch, dry etch, wet etch, RIE, or the like, may be used to form the skip via opening in the first insulator 122.1, in the capping layer 114, in the insulator 112, and in the capping layer 106 through the openings of the resist. The etch may result in substantially vertical skip via opening sidewalls. The etching process can be timed or may otherwise stop at a depth in which a surface (e.g., top surface) of the wiring structure 109 is exposed by the skip via opening. In this way, the subtractive skip via 130 will be at a depth which lands on or contacts the exposed surface of the wiring structure 109 in the $M_a$ level 102. Subsequent to forming the skip via opening, the resist and/or mask may be removed by stripants and/or etchants.

Figure 4:
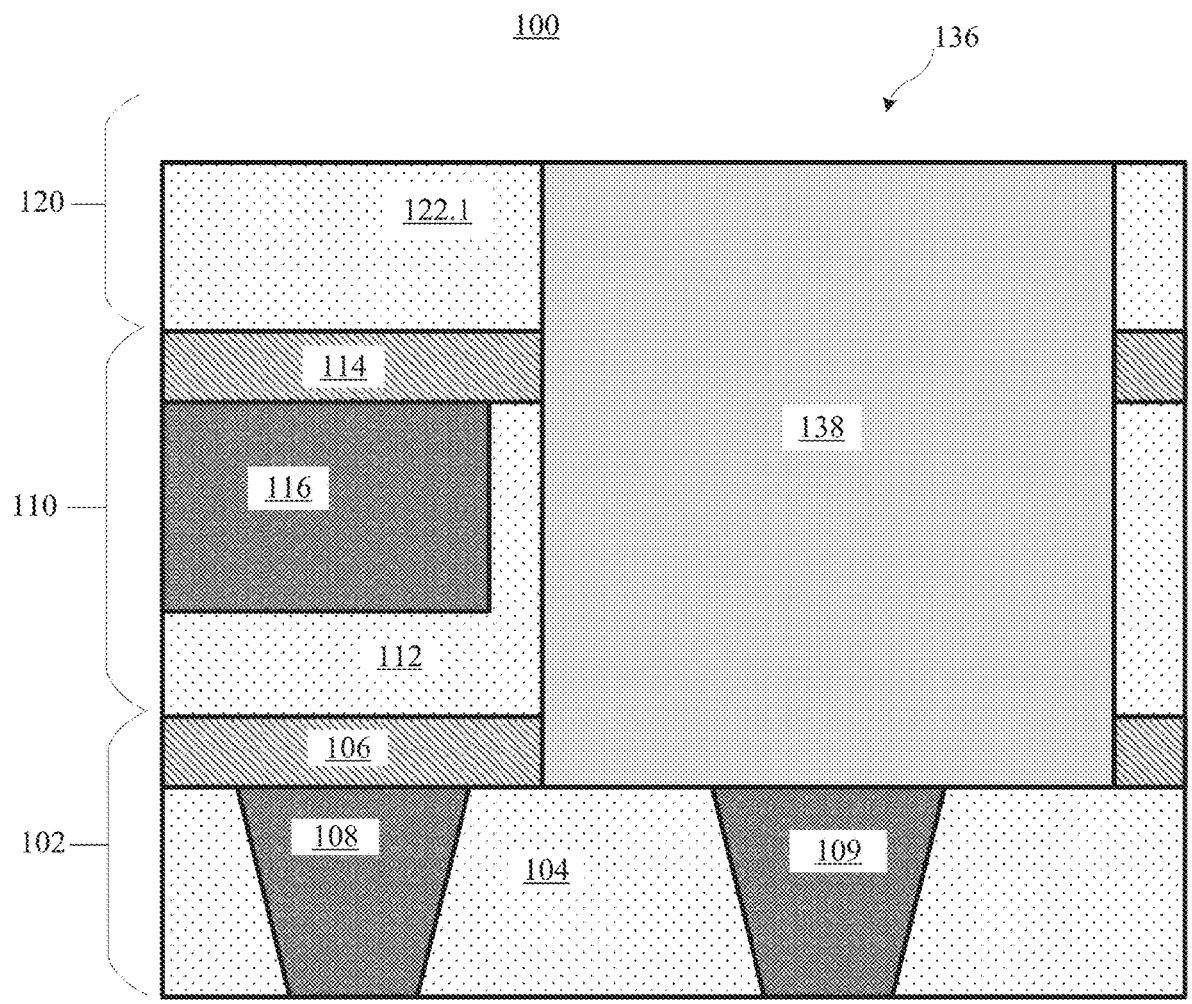

FIG. 4 depicts a cross-sectional view of semiconductor device 100 that is to include the subtractive skip via 130 at a subsequent fabrication stage, according to embodiments of the disclosure. At the present fabrication stage, a conductive fill 138 is formed within skip via opening 136.

The conductive fill 138 may consist of an electrically conductive material, such as a metal and may be a relative different metal relative to the wiring structures 108, 109, 112, or the like within the associated levels. The conductive fill 138 may consist of any conductive material such as, e.g., copper, cobalt, nickel, tungsten, aluminum, ruthenium etc., lined with Ti, Ta, TiN, TaN, ruthenium, cobalt, etc. In a particular example, conductive fill 138 may consist of ruthenium. A CMP process may remove any residual conductive fill 138 material from the surface of the insulator 112.1. For clarity, the conductive fill 138 lands on or contacts the exposed surface or surfaces of the wiring structure 109 in the $M_a$ level 102.

Figure 5:
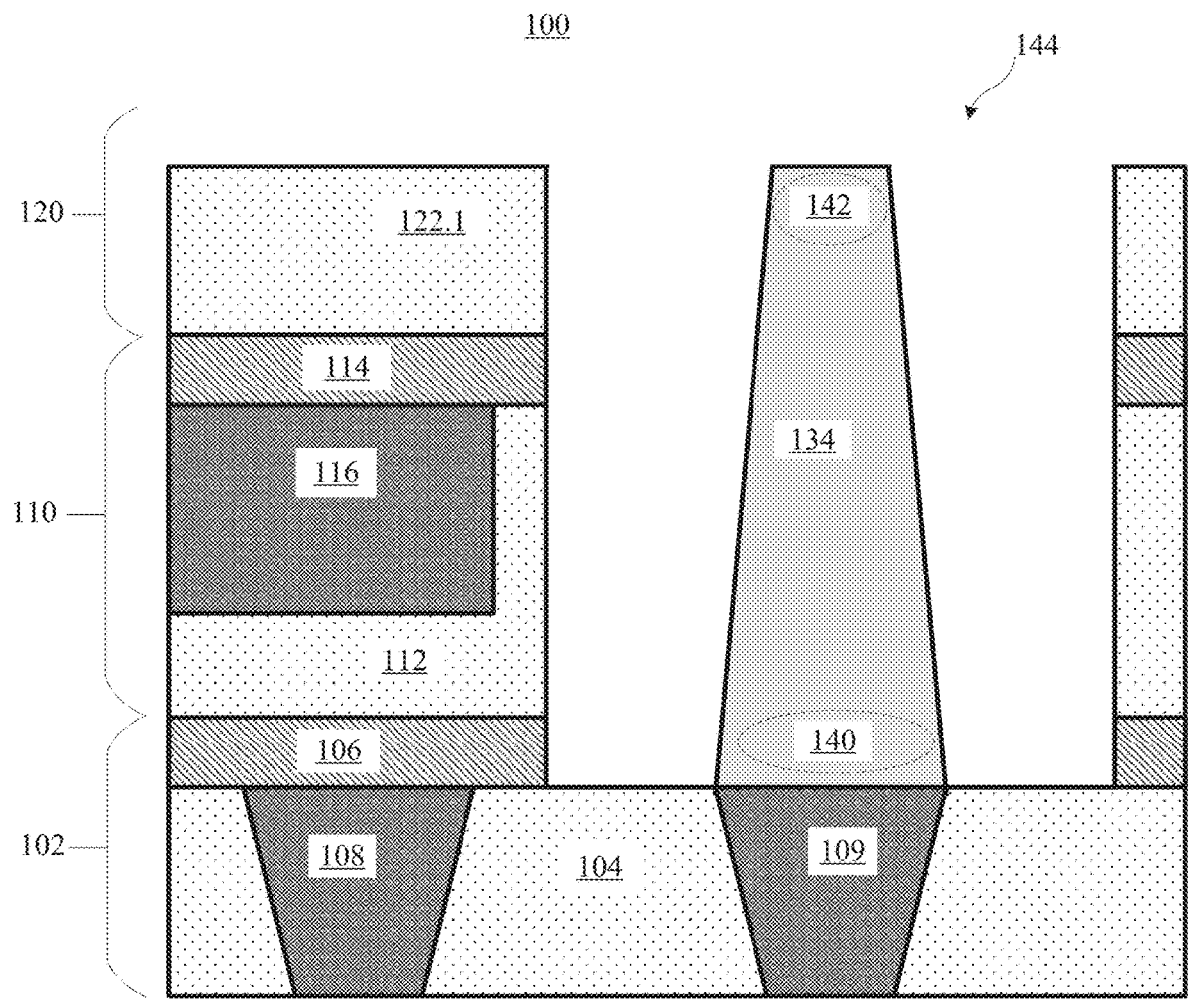

FIG. 5 depicts a cross-sectional view of semiconductor device 100 that is to include the subtractive skip via 130 at a subsequent fabrication stage, according to embodiments of the disclosure. At the present fabrication stage, conductive fill 138 is shaped by removing portion(s) thereof while the conductive fill 138 that remains forms conductive skip via 134.

The conductive skip via 134 can be formed using lithography and etching processes. For example, a masking material (not shown) is formed on the surface of the insulator 122.1 and conductive fill 138. The masking material is patterned by lithography processes, e.g., a resist is formed on the masking material, which is exposed to energy (light) to form a pattern (openings) in vertical alignment with a desired perimeter region of the subtractive skip via 130. Such location or region may have a predefined width from the perimeter of the subtractive skip via 130 of FIG. 1B and FIG. 1C.

An etching process, such as an etch, dry etch, wet etch, RIE, or the like, may be used to form the conductive skip via 134 by removing perimeter portion(s) conductive fill 138 through the openings of the resist. The etch may result in substantially sloped conductive skip via 134 sidewalls. For example, an upper section 142 of conductive skip via 134 may have smaller width, diameter, or the like relative to a lower section 140 of conductive skip via 134. The etching process can be selective to the material of conductive fill 138, such that the material of conductive fill 138 is removed while the insulator 104, capping layer 106, insulator 112, capping layer 114, and insulator 122.1 remains. For clarity, because conductive skip via 134 is formed by removing portion(s) of a relatively larger volume conductive fill 138, conductive skip via 134 is considered in this disclosure as a subtractive conductive skip via. Likewise, the resulting associated subtractive skip via 130 is considered a subtractive skip via. The conductive skip via 134 has a relatively HAR compared to the skip via opening 136 in which conductive skip via 134 is formed. In an example, conductive skip via 134 may have an aspect ratio in which the height or depth of conductive skip via 134 is more than twice the width (e.g., left to right, back to front, etc.) of the conductive skip via 134. Similarly, conductive skip via 134 may have an aspect ratio in which the height or depth of conductive skip via 134 is less than ten times the width of the conductive skip via 134.

For clarity, sidewalls of respective of the first insulator 122.1, of the capping layer 114, of the insulator 112, and of the capping layer 106 internal to the skip via opening 136 may be exposed by the shaping of conductive fill 138. Similarly, a perimeter portion of an upper surface of insulator 104 within the skip via opening 136 may be exposed by the shaping of conductive fill 138. Because portion(s) of conductive fill 138 within the skip via opening 136 are removed, a reformed skip via opening 144 may be resultantly formed. The reformed skip via opening 144 may be bounded between the internal sidewalls of skip via opening 136 and the perimeter of the conductive skip via 134 and between the top surface of insulator 122.1 and the top surface of insulator 104. Subsequent to forming the conductive skip via 134, the resist and/or mask may be removed by stripants and/or etchants.

Figure 6:
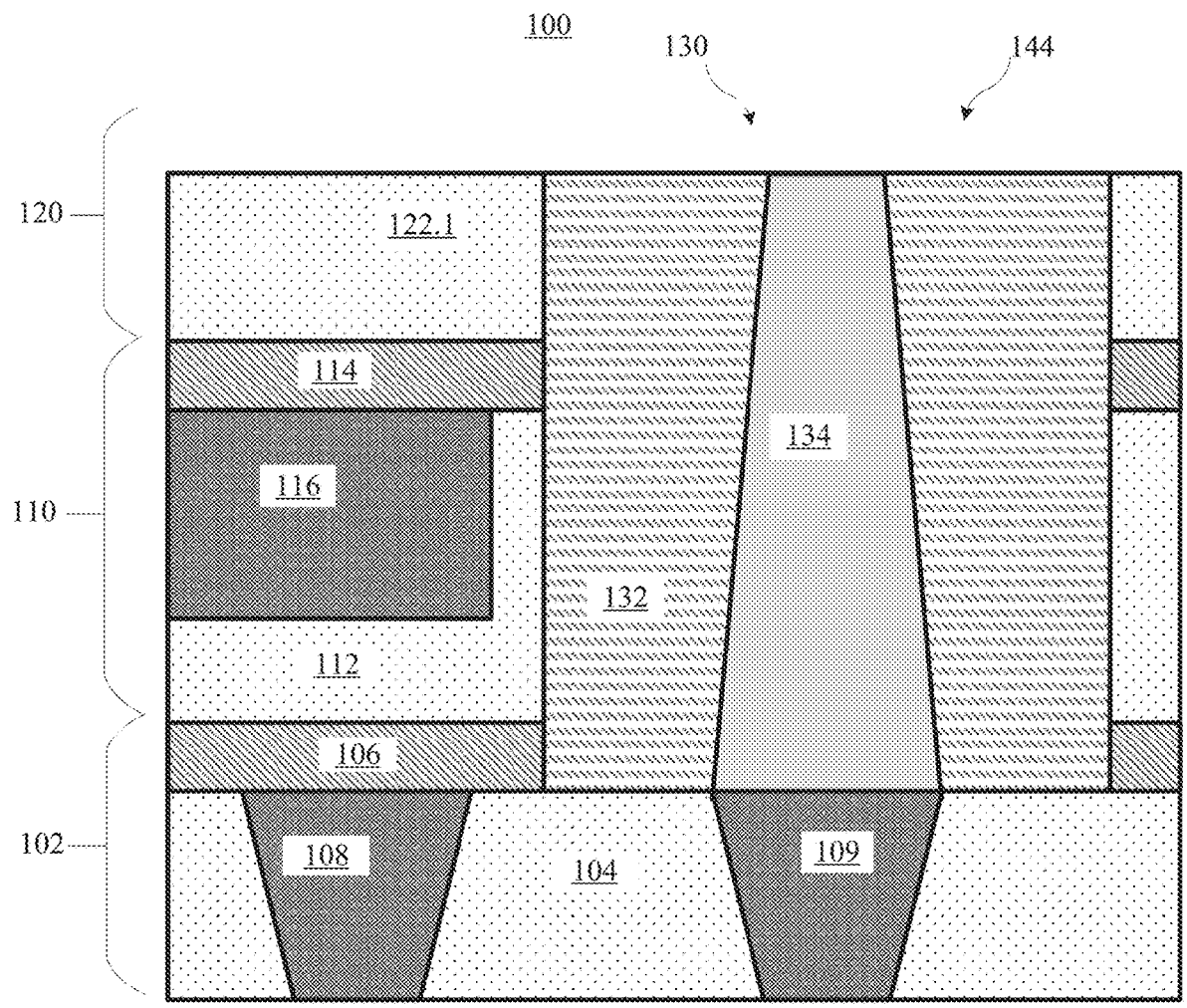

FIG. 6 depicts a cross-sectional view of semiconductor device 100 that is to include the subtractive skip via 130 at a subsequent fabrication stage, according to embodiments of the disclosure. At the present fabrication stage, the subtractive skip via 130 is formed by depositing dielectric backfill 132 around conductive skip via 134 within the reformed skip via opening 144.

Dielectric backfill 132 may be formed around conductive skip via 134 solely within the reformed skip via opening 144. Alternatively, dielectric backfill 132 may be formed around conductive skip via 134 within the reformed skip via opening 144 and upon the top surface of insulator 122.1. In other words, dielectric backfill 132 may be formed as a blanket layer. Dielectric backfill 132 may be formed by depositing a dielectric material such as SiBCN, SiOCN, SiCO, SiCOH, etc. In an example, the material of dielectric backfill 132 is different than the materials of the insulator layers and different than the capping layers. The dielectric material of dielectric backfill 132 and/or geometry of skip via opening may be selected to reduce the propensity of electrical shorting between the conductive skip via 134 and wiring structures 108, 112, 116, etc. Any residual dielectric material of dielectric backfill 132 on the surface of the insulator 122.1 can be removed by a chemical mechanical polishing (CMP) process.

Figure 7:
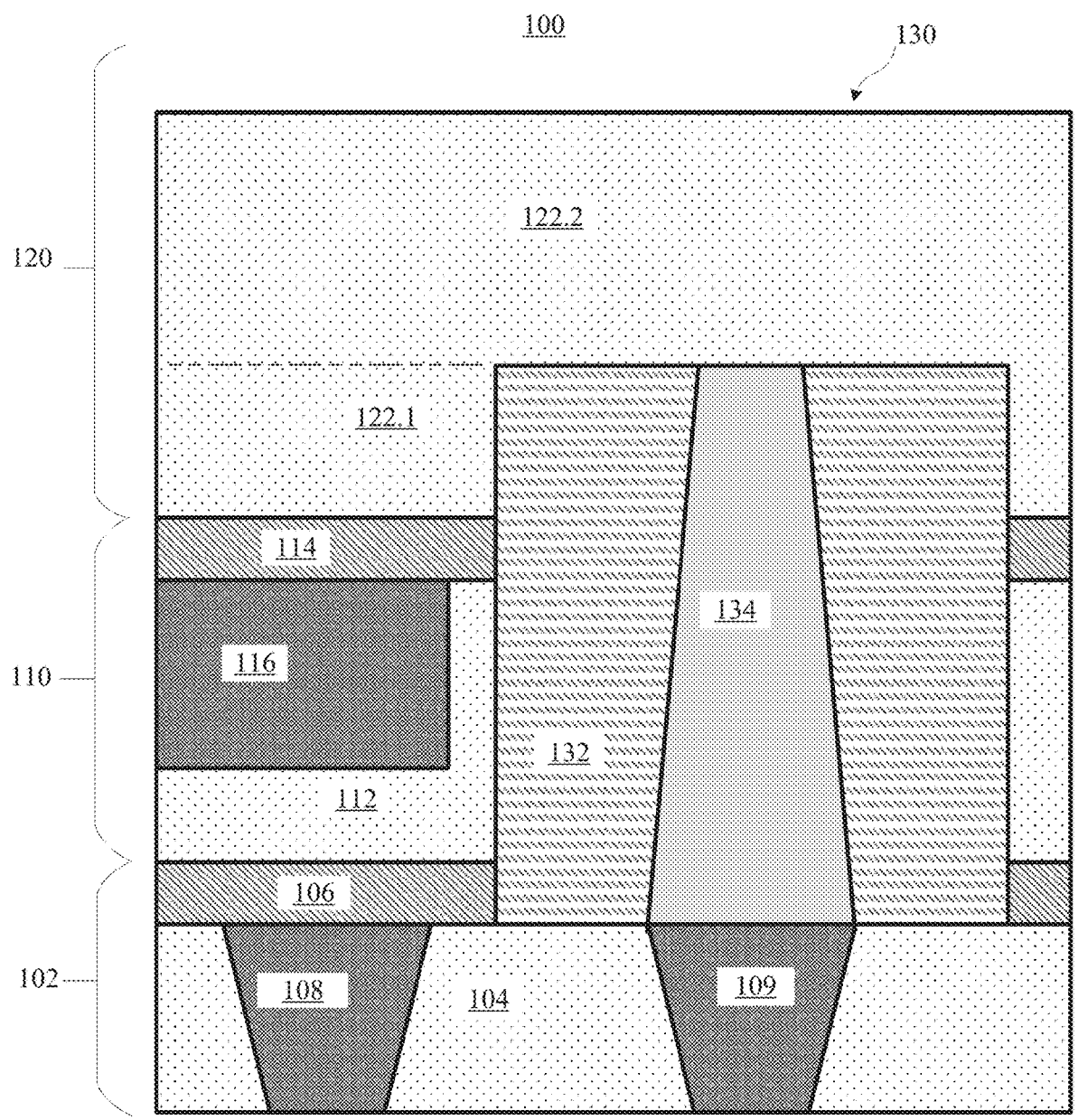

FIG. 7 depicts a cross-sectional view of semiconductor device 100 that includes the subtractive skip via 130 at a subsequent fabrication stage, according to embodiments of the disclosure. At the present fabrication stage, the higher $M_c$ level 120 is further formed by insulator 122.2 being deposited upon the insulator 122.1 and upon the subtractive skip via 130.

In embodiments, the insulator 122 is an oxide-based material (e.g., $SiO_2$ or the like), e.g., interlevel dielectric (ILD) material, which can be deposited by a deposition method, e.g., chemical vapor deposition (CVD). The insulator 122 can also be an ultra-low-k dielectric material, a carbon doped insulator material or other insulator material with porosity, or the like. For clarity, insulator 122.1 and insulator 122.2 may be collectively referred herein as insulator 122.

Figure 8:
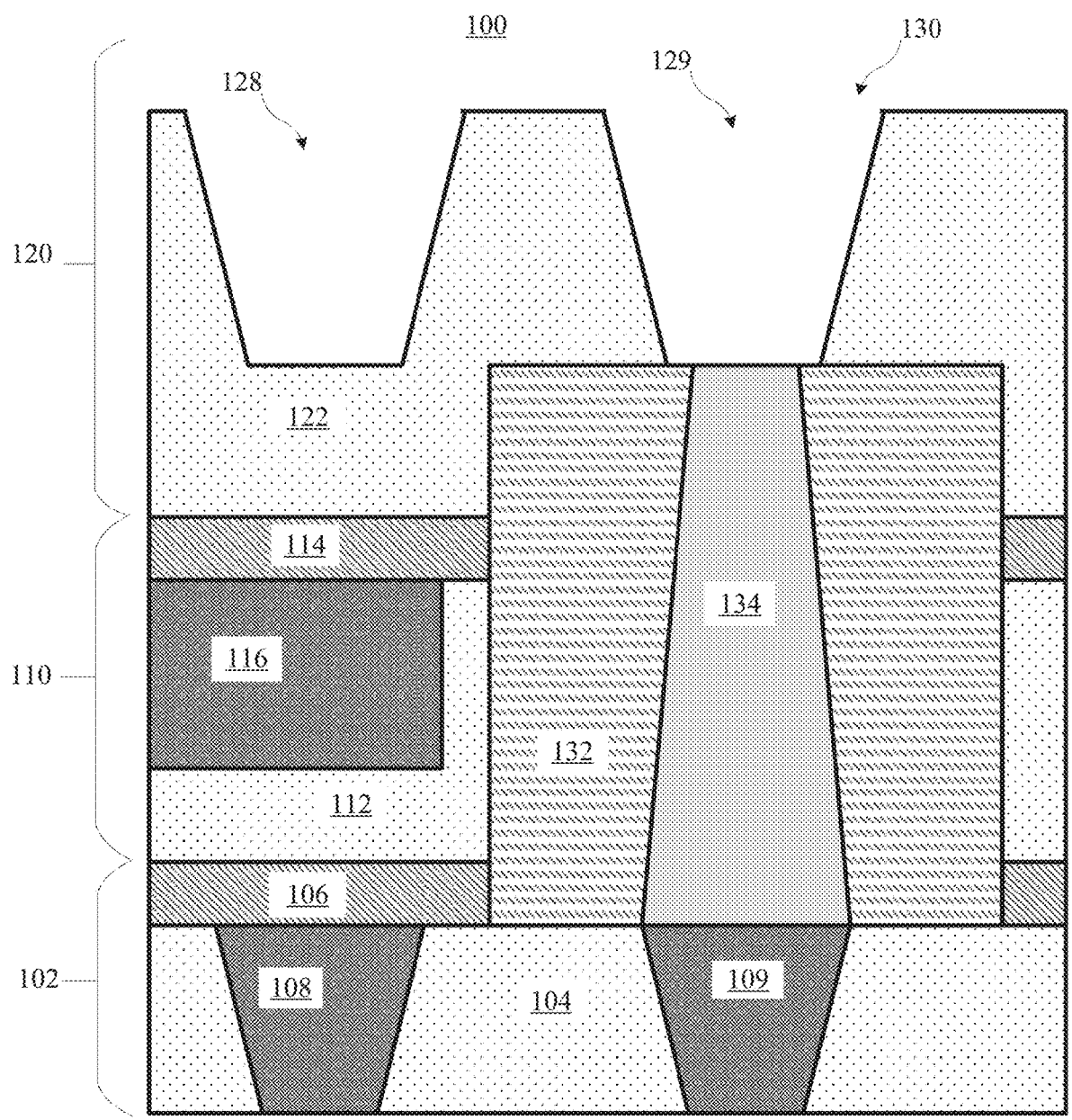

FIG. 8 depicts a cross-sectional view of semiconductor device 100 that includes the subtractive skip via 130 at a subsequent fabrication stage, according to embodiments of the disclosure. At the present fabrication stage, the higher $M_c$ level 120 is further formed by forming wiring trenches 128, 129 and via interconnect trenches (not shown) within insulator 122.

Figure 9:
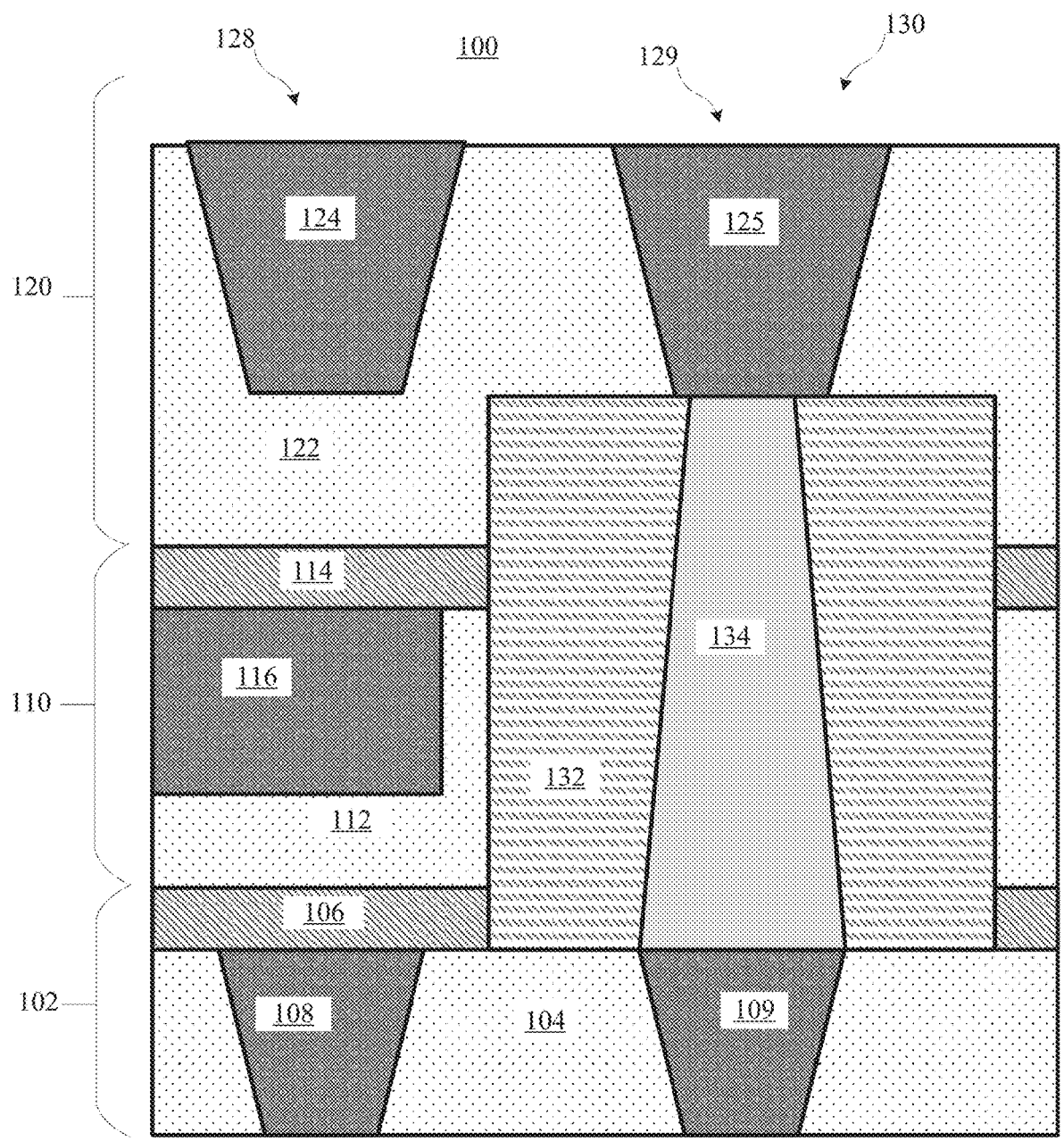

The wiring trenches 128, 129 can be formed by lithography, etching, and deposition methods. For example, a resist formed over the insulator 122 is exposed to energy (light) to form a pattern (opening). An etching process with a selective chemistry, e.g., reactive ion etching (RIE), will be used to form one or more trenches in the insulator 122 through the openings of the resist. The etching process can be timed or may otherwise stop at a depth in which a surface (e.g., top surface) of the conductive skip via 134 is exposed by the wiring trench 129. In this way, the subtractive skip via 130 will be at a height which lands on or contacts the wiring structure 125 in the $M_c$ level 120, as depicted in FIG. 9. The etch that forms wiring trenches 128, 129 may utilize the top surface of dielectric backfill 132 as an etch stop. Subsequent to forming the wiring trenches 128, 129, the resist and/or mask may be removed by stripants and/or etchants.

FIG. 9 depicts a cross-sectional view of semiconductor device 100 that includes the subtractive skip via 130 at a subsequent fabrication stage, according to embodiments of the disclosure. At the present fabrication stage, the higher $M_c$ level 120 is further formed by forming wiring structures 124, 125 within wiring trenches 128, 129, respectively. Further via interconnect structures (not shown) may be formed within the via interconnect trenches (not shown) within insulator 122.

For clarity, the wiring structures 124, 125 may be upper wiring structures, designated at an M3, M4, etc. level; whereas the via interconnect structures (not shown) are upper via interconnect structures designated at V2, V3, etc. level. These via interconnect structures may connect the wiring structure 124 with the wiring structure 116, or the like. In a particular example, wiring structures 108, 109 are in a M1 wiring level, wiring structure 116 is in a M2 wiring level, and wiring structures 124, 125 are in a M3 wiring level.

The wiring structures 124, 125 and the via interconnect structures (not shown) can be formed using conventional lithography, etching, and deposition processes, similar to that which was discussed with respect to the formation of the wiring structures 108, 109. The wiring structures 124, 125 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc. For example, conductive material can be deposited in the one or more wiring trenches 128, 129 by any conventional deposition processes, e.g., chemical vapor deposition (CVD) processes. The wiring structures 124, 125 can be composed of any conductive material such as, e.g., copper, tungsten, cobalt, nickel, aluminum, ruthenium etc. In a particular implementation, the wiring structures 124, 125 are composed of copper. Any residual conductive material on the surface of the insulator 122 can be removed by conventional chemical mechanical polishing (CMP) processes.

Following the CMP process, a capping layer (not shown) may be deposited on the wiring structures 124, 125 and insulator 122. In embodiments, this capping layer can be similar to capping layers 106, 114, etc.

For clarity, embodiments of the disclosure include the subtractive skip via 130 that includes conductive skip via 134 that connects wiring structure 125 within $M_c$ level 120 with wiring structure 109 within $M_a$ wiring level 102 (e.g., subtractive skip via 130 does not contact a wiring structure in $M_b$ wiring level 110). The conductive skip via 134 is subtractively formed by removing portion(s) of a relatively larger metal fill 138. The sides of conductive skip via 134 are surrounded by dielectric backfill 132 which may be a different dielectric material relative to insulators 104, 112, 122, etc. and may be a different dielectric material relative to capping layers 106, 114, etc. Further, conductive skip via 134 may be a different conductive material or metal relative to wiring structure(s) 108, 109, 116, 124, and/or 125. Dielectric backfill 132 may increase subsequent etch selectivity control, such that wiring trench 129 formation may use the dielectric backfill 132 as an etch stop. In certain implementations, multiple subtractive skip vias 130 may be formed and may provide for relatively reduced pitch or spacing therebetween, relative to traditional skip via designs. Because conductive skip via 134 is subtractively formed within the associated skip via opening 136, conductive skip via 134 has a relatively higher aspect ratio compared to the associated skip via opening 136. In this manner, a HAR conductive skip via is formed in LAR skip via opening.

Figure 10:
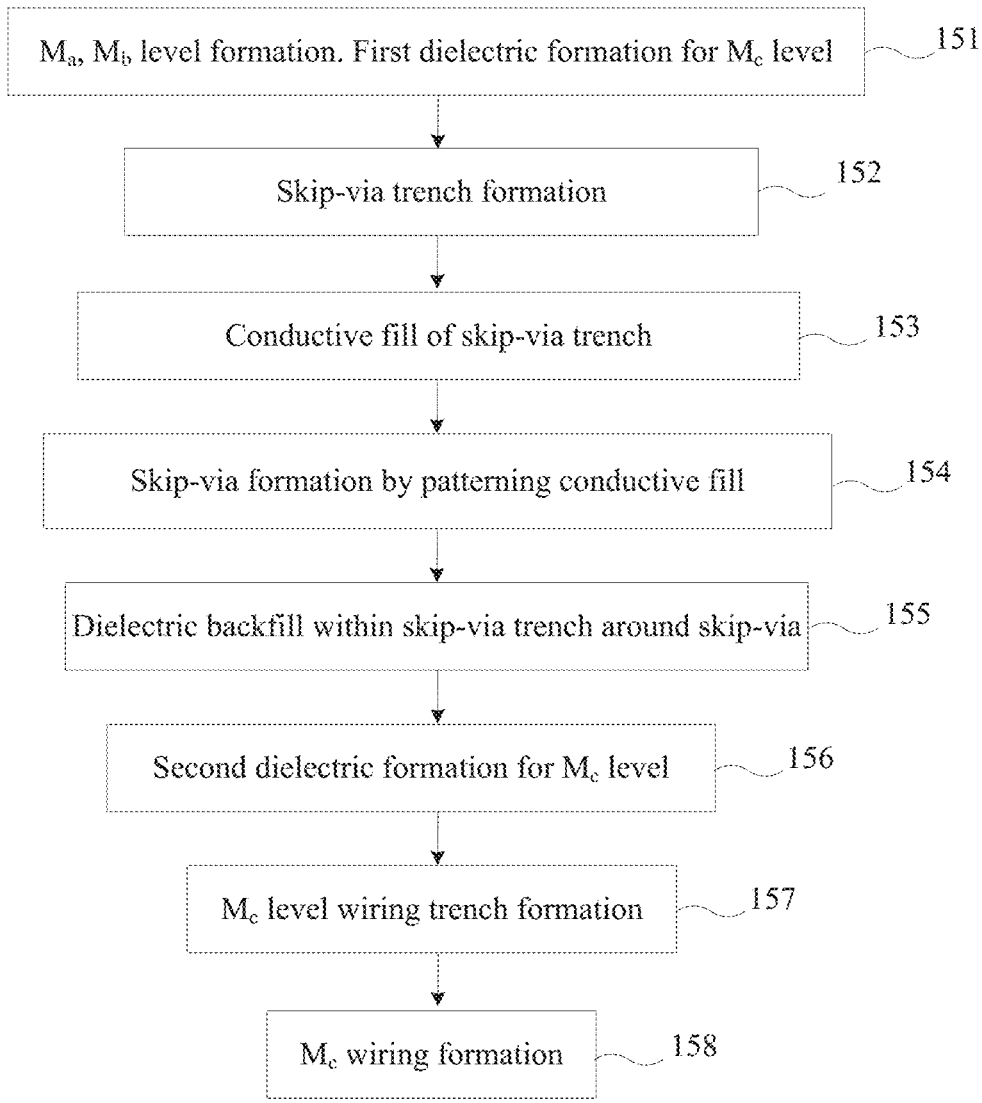
FIG. 10 depicts a method of fabricating a semiconductor device that includes a subtractive skip via, according to embodiments of the disclosure.

FIG. 10 depicts a method 150 of fabricating semiconductor device 100 that includes subtractive skip via 130, according to embodiments of the disclosure. Method 150 begins at block 151 with forming $M_a$ level 102, with forming $M_b$ level 110, and with forming insulator 122.1 within $M_c$ level 120. Method 150 continues at block 152 with forming skip via opening 136 within the first insulator 122.1, within capping layer 114, within insulator 112, and within capping layer 106.

Method 150 may continue at block 153 with forming conductive fill 138 within the skip via opening 136 and may continue at block 154 by shaping or patterning the conductive fill 138 by removing portion(s) thereof while retaining and thereby forming conductive skip via 134. Method 150 may continue at block 155 with forming dielectric backfill 132 around the side perimeter of the forming conductive skip via 134 within the skip via opening 136, thereby forming subtractive skip via 130.

Method 150 may continue at block 156 with forming insulator 122.2 upon the subtractive skip via 130 and upon the insulator 122.1 within $M_c$ level 120, may continue at block 157 with forming wiring trench 129 within $M_c$ level 120, and may continue at block 158 with forming wiring structure 125 within wiring trench 129 within $M_c$ level 120.

Figures 11A, 11B, 11C:
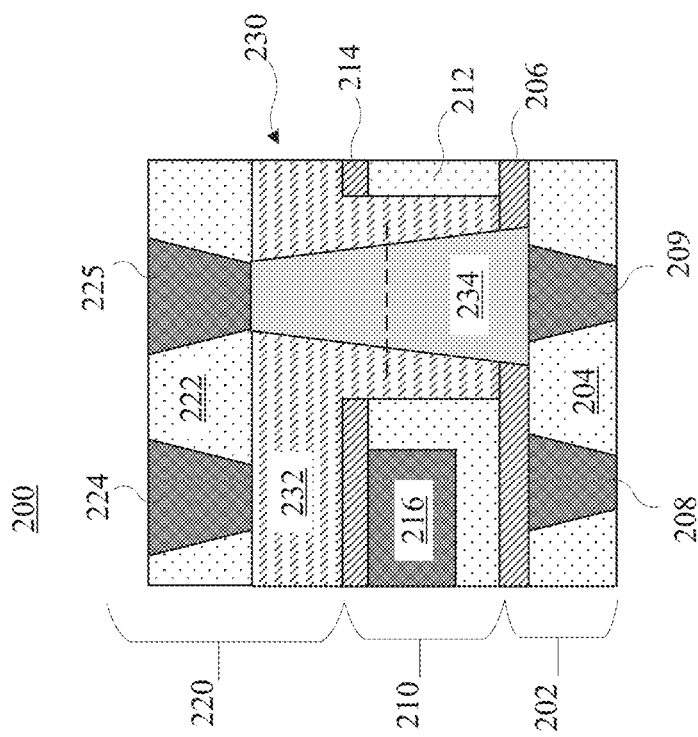
FIG. 11A depicts a cross-sectional view of a semiconductor device that includes a subtractive skip via, according to embodiments of the disclosure.
FIG. 11B and FIG. 11C depicts different orthogonal cross-sectional views of the subtractive skip via of FIG. 11A, according to embodiments of the disclosure.

Referring now to FIG. 11A which depicts a cross-sectional view of a semiconductor device 200 that includes a subtractive skip via 230, according to embodiments of the disclosure.

In embodiments, the semiconductor device 200 can be a back end of the line (BEOL) or middle of the line (MOL) structure. In particular, the semiconductor device 200 includes a plurality of wiring levels, e.g., $M_a$ level 202, $M_b$ level 210, $M_c$ level 220, etc., in an IC device, such as a microprocessor, die, wafer, or the like. For example, the semiconductor device 200 includes wiring structures 208, 209 provided in an insulator 204 in $M_a$ level 202. For clarity, the wiring structures 208, 209 are lower wiring structures, designated representatively at a lower level (e.g., M0 level for BEOL), or CA/CB level for MOL, although the wiring structures 208, 209 can be provided at any lower level of the semiconductor device 200. When wiring structures 208, 209 are in the CA/CB level for MOL, then wiring structure 216 is a relatively higher wiring level (e.g., M0 level for BEOL).

In embodiments, the insulator 204 is an oxide-based material, e.g., ILD material, which can be deposited by a deposition method, e.g., CVD, etc. The insulator 204 can also be an ultra low-k dielectric material, a carbon doped insulator material or other insulator material with porosity.

The wiring structures 208, 209 can be formed by lithography, etching, and deposition methods. For example, a resist formed over the insulator 204 is exposed to energy (light) to form a pattern (opening). An etching process with a selective chemistry, e.g., RIE, will be used to form one or more trenches in the insulator 204 through the openings of the resist. The resist can then be removed by a conventional oxygen ashing process or other known stripants. Following the resist removal, conductive material can be deposited in the one or more trenches by any conventional deposition processes, e.g., CVD processes. The wiring structures 208, 209 can be composed of any conductive material such as, e.g., copper, tungsten, cobalt, nickel, aluminum, ruthenium etc. In a particular implementation, the wiring structures 208, 209 are composed of copper. The wiring structures 208, 209 can also be lined with Ti, Ta, TiN, TaN, ruthenium, cobalt, etc. Any residual conductive material on the surface of the insulator 204 can be removed by conventional CMP processes.

Following the CMP process, a capping layer 206 is deposited on the wiring structures 208, 209 and insulator 204. In embodiments, the capping layer 206 can be a diffusion barrier layer, e.g., copper diffusion barrier layer, which prevents copper or other metallization diffusion to an insulator 212 as well as preventing oxygen diffusion to the wiring structures 208, 209.

Next, a higher $M_b$ level 210 is formed. $M_b$ level 210 may be formed with similar techniques relative to the $M_a$ level 202 and may include wiring structure 216 and via interconnect structures (not shown) within the insulator 212. In embodiments, the wiring structure 216 and the via interconnect structures can be formed in any wiring layer above that of the wiring structures 208, 209.

For clarity, the wiring structure 216 may be upper wiring structures, designated at an M1, M2, etc. level; whereas the via interconnect structures (not shown) are upper via interconnect structures designated at V0, V1, etc. level. These via interconnect structures may connect the wiring structure 216 with the wiring structure 208, or the like.

The wiring structure 216 and the via interconnect structures (not shown) can be formed using conventional lithography, etching, and deposition processes, similar to that which was discussed with respect to the formation of the wiring structures 208, 209. The wiring structure 216 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 212, a capping layer 214 is formed on the wiring structure 216 and insulator 212. In embodiments, the capping layer 214 can be a diffusion barrier layer, e.g., copper diffusion barrier layer, as described above, the insulator 212 can be any insulator material as described above.

Next, a skip via opening is formed within insulator 222 that exposes a portion of the wiring structure 209. A conductive material may fill the skip via opening and may be subsequently patterned or shaped. Undesired portions of the metal fill may be removed and a retained portion thereof forms the conductive skip via 234. After the conductive skip via 234 is formed, the dielectric backfill 232 may be formed therearound and upon the capping layer 214. The dielectric backfill 232 material and geometry may be selected to reduce shorting propensities between the conductive skip via 234 and the wiring structures 208, 216, 224 that which the conductive skip via 234 is not intended to be connected. Further the dielectric backfill 232 may increase subsequent etch selectivity control and be used as an etch stop to form the trenches of wiring structures 224, 225. In certain implementations, the subtractive skip via 230 may provide for reduced skip via to skip via pitch or spacing relative to traditional skip via integrations.

For clarity, the subtractive skip via 230 does not contact with any wiring structure $M_b$ level 210 and thereby skips at least the $M_b$ level 210, as depicted. The subtractive skip via 230 includes conductive skip via 234 surrounded by dielectric backfill 232.

Next, one or more additional portions of $M_c$ level 220 are formed. $M_c$ level 220 may be formed with similar techniques relative to the below level(s) and may include wiring structures 224, 225 and via interconnect structures (not shown) within an insulator 222. In embodiments, the wiring structures 224, 225 and the via interconnect structures can be formed in any wiring layer above that of the wiring structure 216.

For clarity, the wiring structures 224, 225 may be upper wiring structures, designated at an M2, M3, etc. level; whereas the via interconnect structures (not shown) are upper via interconnect structures designated at V1, V2, etc. level. These via interconnect structures may connect the wiring structure 224 with the wiring structure 216, or the like. In a particular example, wiring structures 208, 209 are in a M1 wiring level, wiring structure 216 is in a M2 wiring level, and wiring structures 224, 225 are in a M3 wiring level.

The wiring structures 224, 225 and the via interconnect structures (not shown) can be formed using conventional lithography, etching, and deposition processes, similar to that which was discussed with respect to the formation of the wiring structures 208, 209, and/or 216. The wiring structures 224, 225 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 222, a capping layer (not shown) may be formed on the wiring structures 224, 225 and insulator 222. In embodiments, the capping layer (not shown) can be a diffusion barrier layer, e.g., copper diffusion barrier layer, as described above, the insulator 222 can be any insulator material as described above.

FIG. 11B and FIG. 11C depict different orthogonal cross-sectional views of the subtractive skip via 230, according to embodiments of the disclosure. For example, the dielectric backfill 232 may have a circular, rectangular, square (as depicted in both FIG. 11B and FIG. 11C) orthogonal cross-sectional view shape, though other shapes may be realized. Further, the dielectric backfill 232 may have a circular (as depicted in FIG. 11B), rectangular, square (as depicted in FIG. 11C) orthogonal cross-sectional view shapes, though other shapes may be realized. The orthogonal cross-sectional plane of FIG. 11B and FIG. 11C is depicted as a dashed line through the subtractive skip via 230 in FIG. 11A.

Figure 12:
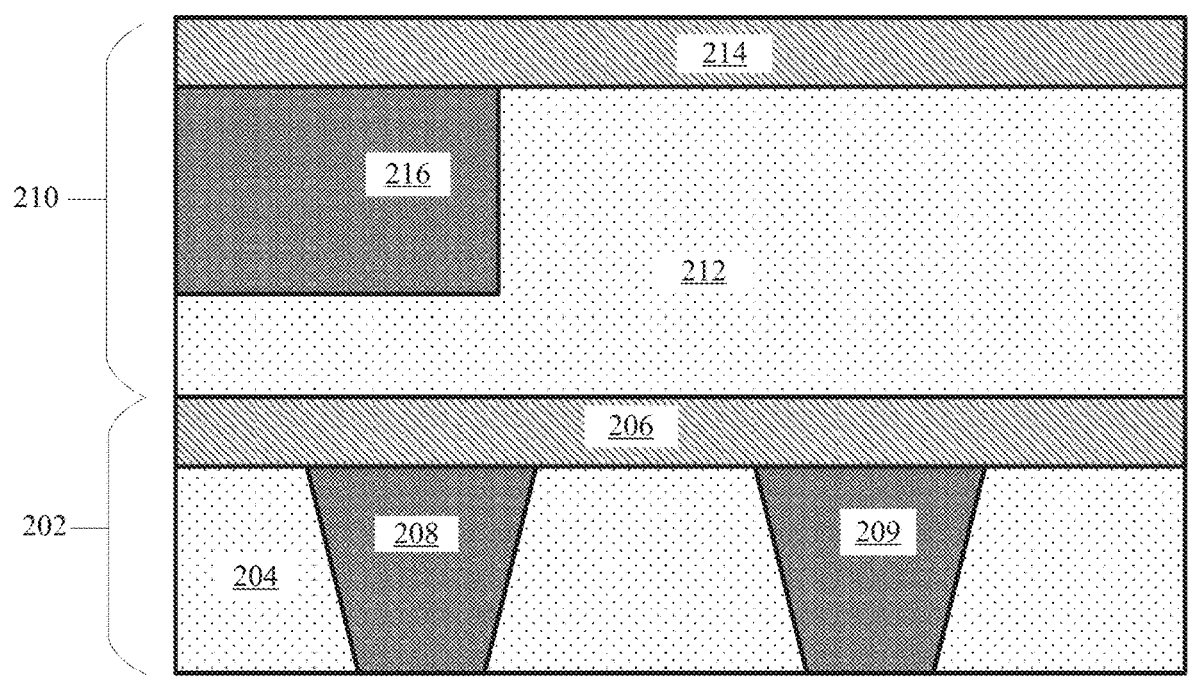
FIG. 12 through FIG. 19 depicts cross-sectional views of a semiconductor device that includes a subtractive skip via at stages of the semiconductor device fabrication process, according to embodiments of the disclosure.

FIG. 12 depicts a cross-sectional view of semiconductor device 200 that is to include the subtractive skip via 230 at an initial fabrication stage, according to embodiments of the disclosure.

Initially $M_a$ level 202 is formed upon an underlying IC device layer (not shown), such as a microprocessor layer, die layer, wafer layer, or the like. For example, insulator 204 is formed upon a device level, such as front end of the line (FEOL) layer, MOL layer, or the like. The insulator may be formed by depositing the oxide, ultra low-k dielectric, carbon doped insulator material, or other insulator material with porosity, or the like, upon the underlying IC device layer (not shown).

Wiring structures 208, 209 may be formed in the insulator 204. The wiring structures 208, 209 can be formed by lithography, etching, and deposition methods. For example, a resist (not shown) formed over the insulator 204 is exposed to energy (e.g., light, etc.) to form a pattern (opening). An etching process with a selective chemistry, e.g., reactive ion etching (RIE), may be used to form one or more trenches in the insulator 204 through the openings of the resist. Such etching technique may result in sloped sidewalls, such that the width of the top of the trenches are greater than the width of the bottom of the trenches, as depicted. The resist can then be removed by a conventional oxygen ashing process or other known stripants.

Following the resist removal, wiring structures 208, 209 may be further fabricated by depositing conductive material in the one or more trenches by a deposition process, e.g., chemical vapor deposition (CVD) process, or the like. The wiring structures 208, 209 can be composed of any conductive material such as, e.g., copper, tungsten, cobalt, nickel, aluminum, ruthenium etc. In a particular implementation, the wiring structures 208, 209 are composed of copper. The wiring structures 208, 209 can also be lined with Ti, Ta, TiN, TaN, ruthenium, cobalt, etc. Any residual conductive material on the surface of the insulator 204 can be removed by a chemical mechanical polishing (CMP) process.

Following the CMP process, a capping layer 206 is deposited on the wiring structures 208, 209 and insulator 204. In embodiments, the capping layer 206 can be a diffusion barrier layer, e.g., copper diffusion barrier layer, which prevents copper or other metallization diffusion to an insulator 112 as well as preventing oxygen diffusion to the wiring structures 208, 209.

Next, the $M_b$ level 210 is formed. $M_b$ level 210 may be formed with similar techniques relative to the $M_a$ level 202 and may include wiring structure 216 and via interconnect structures (not shown) within the insulator 212. In embodiments, the wiring structure 216 and the via interconnect structures can be formed in any wiring layer above that of the wiring structures 208, 209.

For clarity, the wiring structure 216 may be an upper or higher wiring structure, designated at an M1, M2, etc. level; whereas the via interconnect structures (not shown) are upper via interconnect structures designated at V0, V1, etc. level. These via interconnect structures may connect the wiring structure 216 with the wiring structure 208, or the like.

The wiring structure 216 and the via interconnect structures (not shown) can be formed using conventional lithography, etching, and deposition processes, similar to that which was discussed with respect to the formation of the wiring structures 208, 209. The wiring structure 216 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Figure 13:
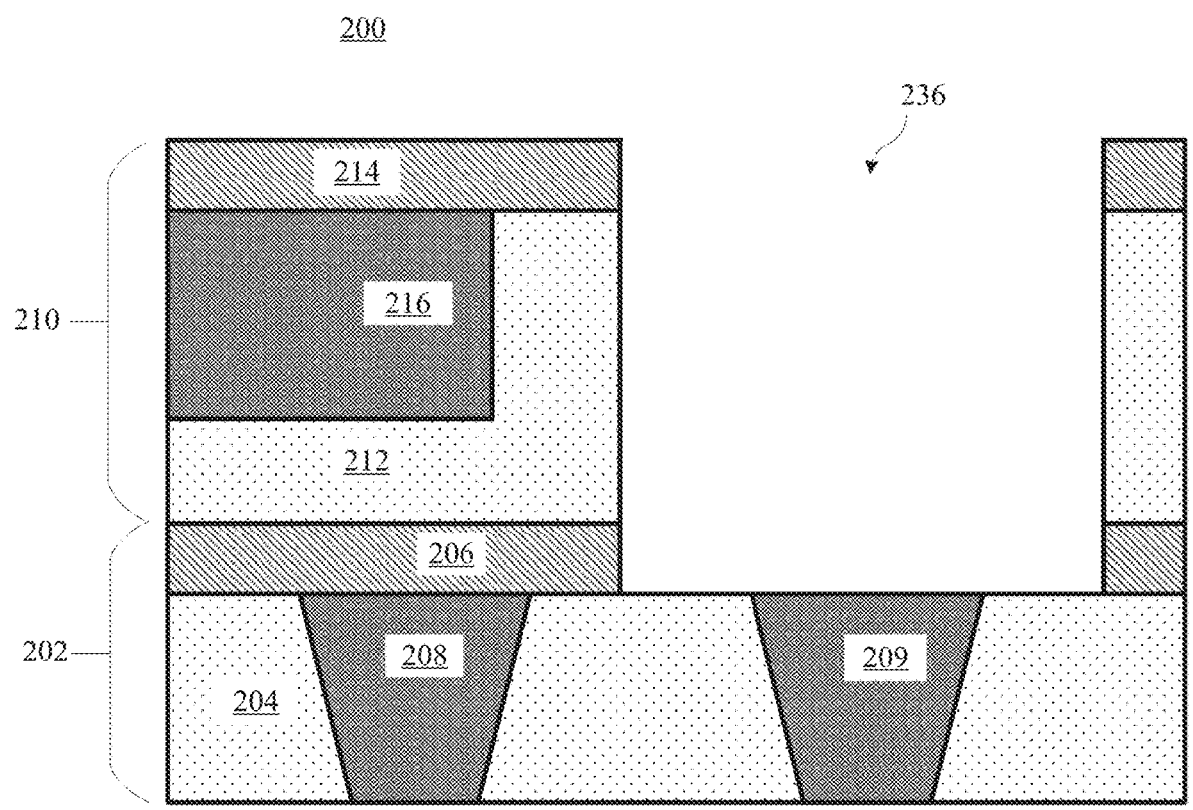

FIG. 13 depicts a cross-sectional view of semiconductor device 200 that is to include the subtractive skip via 230 at a subsequent fabrication stage, according to embodiments of the disclosure. At the present fabrication stage, a skip via opening 236 is formed within capping layer 214, within insulator 212, and within capping layer 206.

The skip via opening 236 can be formed using lithography and etching processes. For example, a masking material (not shown) is formed on the surface of the capping layer 214. The masking material is patterned by lithography processes, e.g., a resist is formed on the masking material, which is exposed to energy (light) to form a pattern (openings) in alignment with a desired location or region of the subtractive skip via 230. Such location or region, as exemplary defined by the perimeter of the subtractive skip via 230 of FIG. 11B and FIG. 11C, has sufficient side to side dimension and/or front to rear dimension in relation to the depth of the skip via opening 236 for the skip via opening 236 to have a relatively lower aspect ratio as compared to the subtractive skip via formed therein.

An etching process, such as an antitropic etch, dry etch, wet etch, RIE, or the like, may be used to form the skip via opening 236 in the capping layer 214, in the insulator 212, and in the capping layer 206 through the openings of the resist. The etch may result in substantially vertical skip via opening 236 sidewalls. The etching process can be timed or may otherwise stop at a depth in which a surface (e.g., top surface) of the wiring structure 209 is exposed by the skip via opening 236. In this way, the subtractive skip via 230 will be at a depth which lands on or contacts the exposed surface of the wiring structure 209 in the $M_a$ level 202. Subsequent to forming the skip via opening 236, the resist and/or mask may be removed by stripants and/or etchants.

Figure 14:
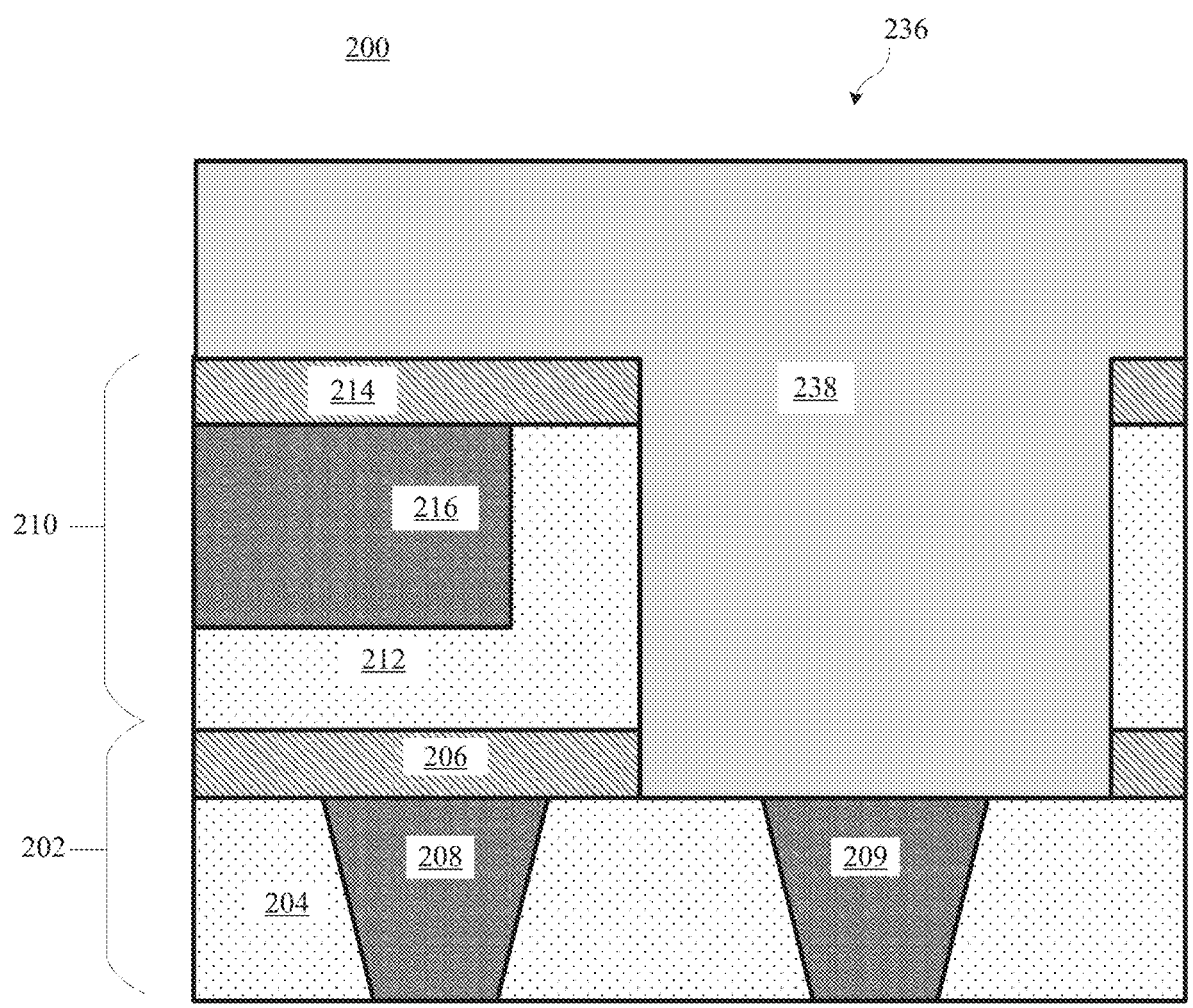

FIG. 14 depicts a cross-sectional view of semiconductor device 200 that is to include the subtractive skip via 230 at a subsequent fabrication stage, according to embodiments of the disclosure. At the present fabrication stage, a conductive fill 238 is formed within skip via opening 236.

The conductive fill 238 may consist of an electrically conductive material, such as a metal and may be a relative different metal relative to the wiring structures 208, 209, 212, or the like within the associated levels. The conductive fill 238 may consist of any conductive material such as, e.g., copper, cobalt, nickel, tungsten, aluminum, ruthenium etc., lined with Ti, Ta, TiN, TaN, ruthenium, cobalt, etc. In a particular example, conductive fill 238 may consist of ruthenium. A CMP process may remove any residual conductive fill 238 material from the surface of the insulator 212.1. For clarity, the conductive fill 238 lands on or contacts the exposed surface or surfaces of the wiring structure 209 in the $M_a$ level 202.

Figure 15:
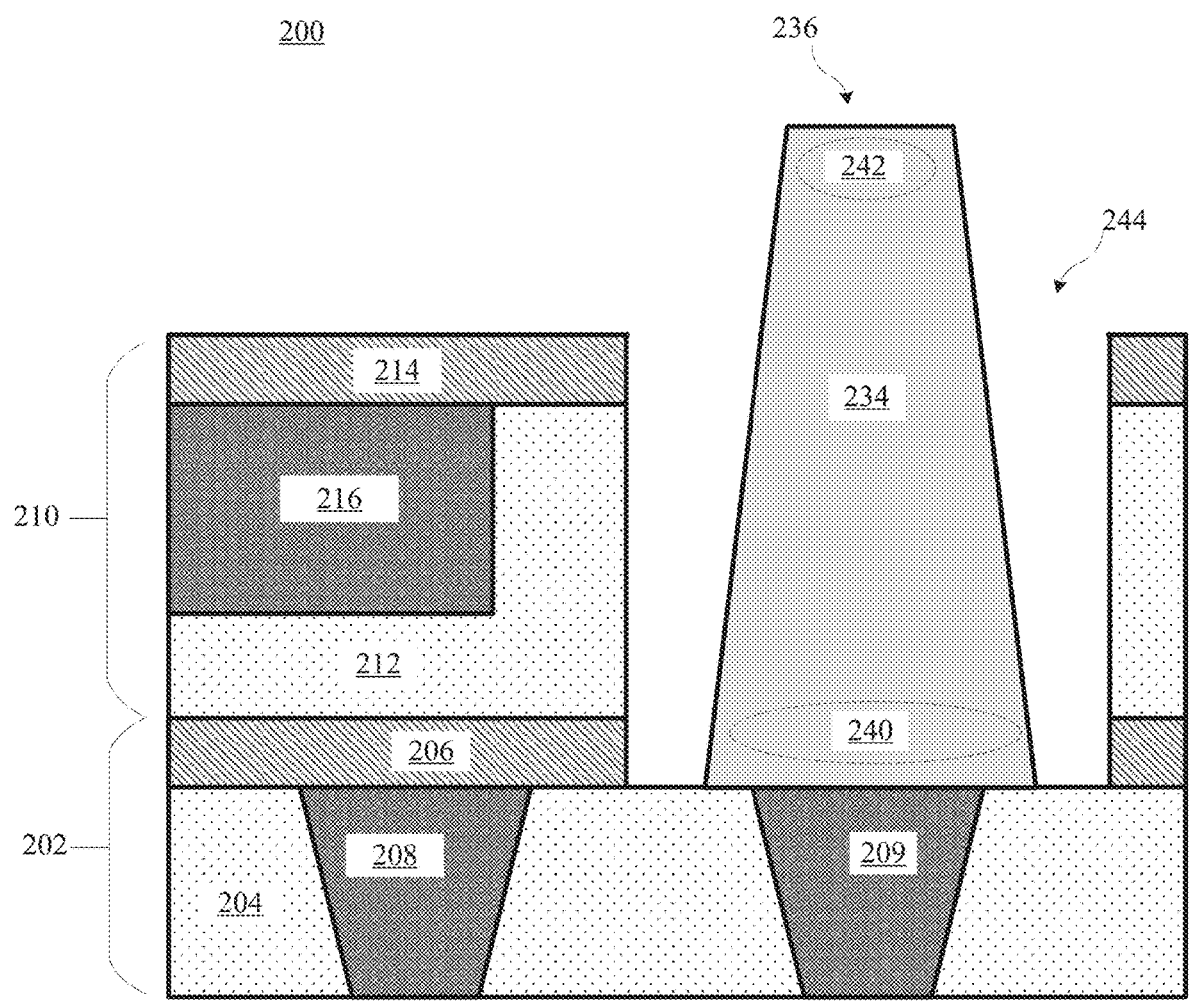

FIG. 15 depicts a cross-sectional view of semiconductor device 200 that is to include the subtractive skip via 230 at a subsequent fabrication stage, according to embodiments of the disclosure. At the present fabrication stage, conductive fill 238 is shaped by removing portion(s) thereof while the conductive fill 238 that remains forms conductive skip via 234.

The conductive skip via 234 can be formed using lithography and etching processes. For example, a masking material (not shown) is formed on the surface of the conductive fill 238. The masking material is patterned by lithography processes, e.g., a resist is formed on the masking material, which is exposed to energy (light) to form a pattern (openings) in vertical alignment with a desired perimeter region of the subtractive skip via 230. Such location or region may have a predefined width from the perimeter of the subtractive skip via 230 of FIG. 11B and FIG. 11C.

An etching process, such as an etch, dry etch, wet etch, RIE, or the like, may be used to form the conductive skip via 234 by removing perimeter portion(s) conductive fill 238 through the openings of the resist. The etch may result in substantially sloped conductive skip via 234 sidewalls. For example, an upper section 242 of conductive skip via 234 may have smaller width, diameter, or the like relative to a lower section 240 of conductive skip via 234. The etching process can be selective to the material of conductive fill 238, such that the material of conductive fill 238 is removed while the insulator 204, capping layer 206, insulator 212, and capping layer 214. For clarity, because conductive skip via 234 is formed by removing portion(s) of a relatively larger volume conductive fill 238, conductive skip via 234 is considered in this disclosure as a subtractive conductive skip via. Likewise, the resulting associated subtractive skip via 230 is considered a subtractive skip via.

The conductive skip via 234 has a relatively HAR compared to the skip via opening 236 in which conductive skip via 234 is formed. In an example, conductive skip via 234 may have an aspect ratio in which the height or depth of conductive skip via 234 is more than twice the width (e.g., left to right, back to front, etc.) of the conductive skip via 234. Similarly, conductive skip via 234 may have an aspect ratio in which the height or depth of conductive skip via 134 is less than ten times the width of the conductive skip via 234.

For clarity, sidewalls of respective of the capping layer 214, the insulator 212, and of the capping layer 206 internal to the skip via opening 236 may be exposed by the shaping of conductive fill 238, as depicted. Similarly, a perimeter portion of an upper surface of insulator 204 within the skip via opening 236 may be exposed by the shaping of conductive fill 238, as depicted. Because portion(s) of conductive fill 238 within the skip via opening 236 are removed, a reformed skip via opening 244 may be resultantly formed. The reformed skip via opening 244 may be bounded between the internal sidewalls of skip via opening 236 and the perimeter of the conductive skip via 234 and between the top surface of capping layer 214 and the top surface of insulator 204.

Subsequent to forming the conductive skip via 234, the resist and/or mask may be removed by stripants and/or etchants.

Figure 16:
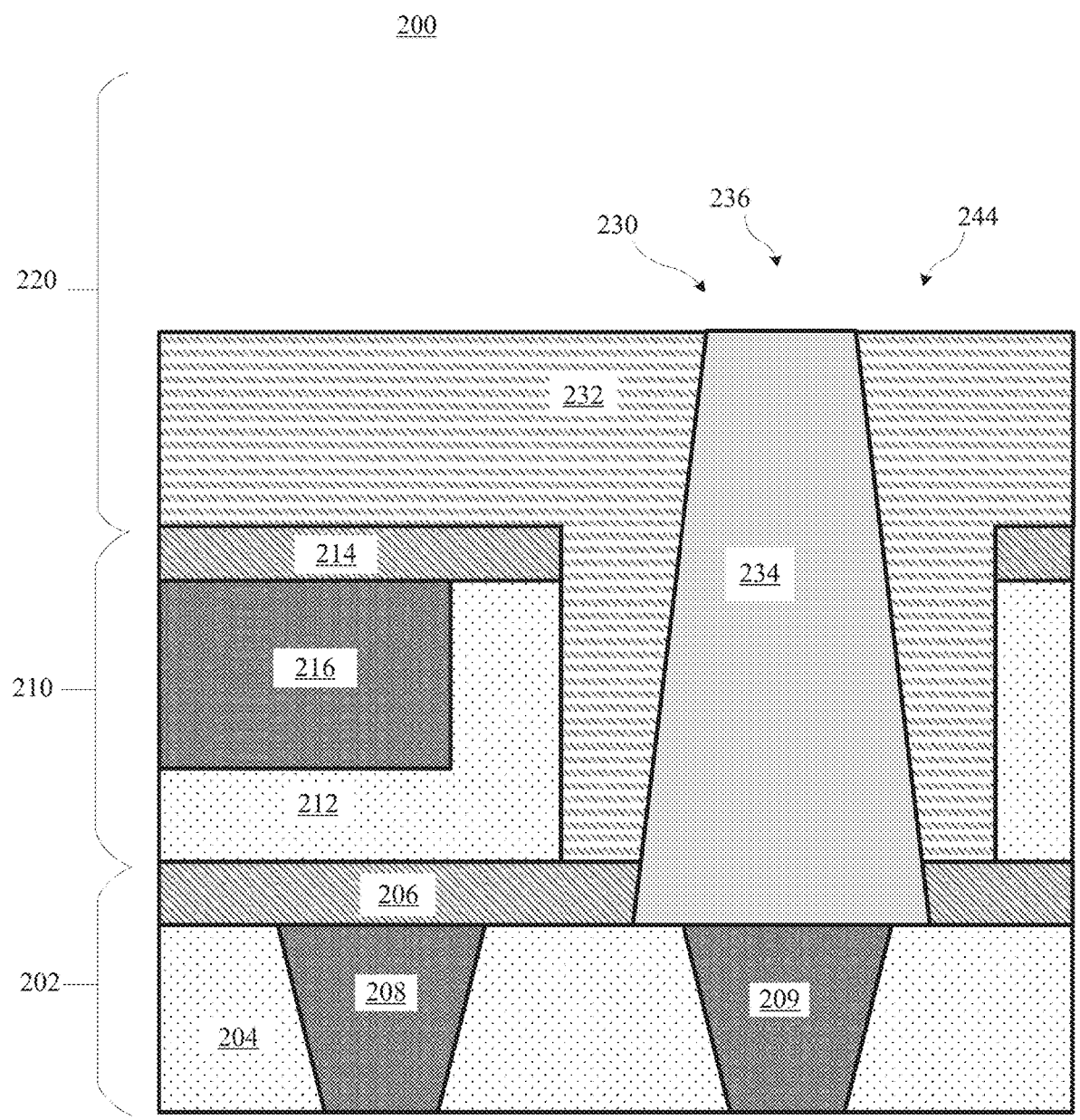

FIG. 16 depicts a cross-sectional view of semiconductor device 200 that is to include the subtractive skip via 230 at a subsequent fabrication stage, according to embodiments of the disclosure. At the present fabrication stage, subtractive skip via 230 is formed by depositing dielectric backfill 232 around conductive skip via 234 within the reformed skip via opening 244 and upon the capping layer 214.

Dielectric backfill 232 may be formed upon the capping layer 214 and around conductive skip via 234 within the reformed skip via opening 244. In other words, dielectric backfill 232 may be formed as a blanket layer. Dielectric backfill 232 may be formed by depositing a dielectric material such as SiBCN, SiOCN, SiCO, SiCOH, etc. In an example, the material of dielectric backfill 232 is different than the materials of the insulator layers and different than the capping layers. The dielectric material of dielectric backfill 232 and/or geometry of skip via opening 236 may be selected to reduce the propensity of electrical shorting between the conductive skip via 234 and wiring structures 208, 212, etc. Any residual dielectric material of dielectric backfill 232 on the surface conductive skip via 234 can be removed by a chemical mechanical polishing (CMP) process. For clarity, the higher $M_c$ level 220 may be partially formed (e.g., dielectric backfill 232 is formed, etc.) at the present fabrication stage.

Figure 17:
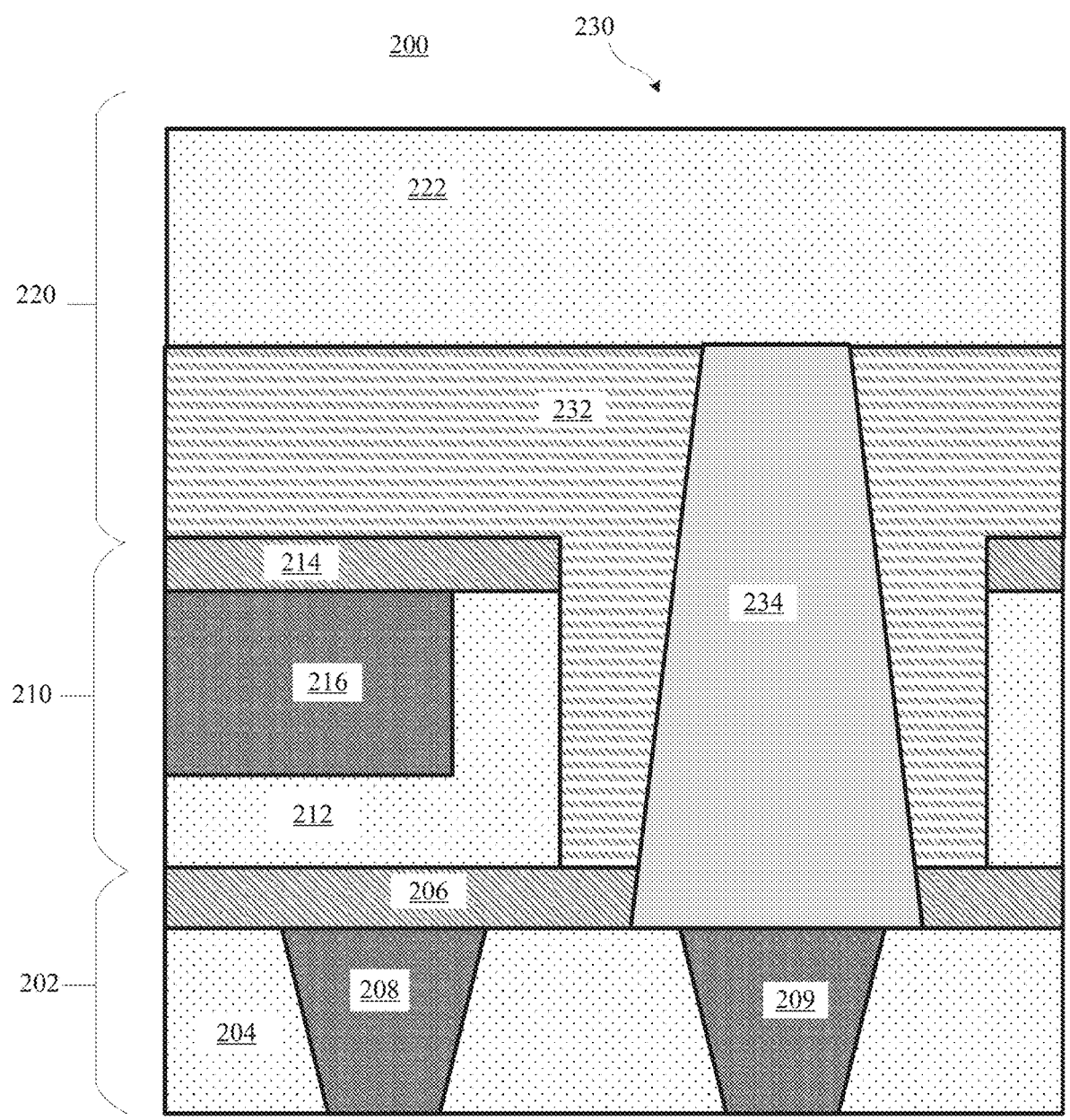

FIG. 17 depicts a cross-sectional view of semiconductor device 200 that includes the subtractive skip via 230 at a subsequent fabrication stage, according to embodiments of the disclosure. At the present fabrication stage, the higher $M_c$ level 220 is further formed by insulator 222 and upon the subtractive skip via 230.

In embodiments, the insulator 222 is an oxide-based material (e.g., $SiO_2$ or the like), e.g., interlevel dielectric (ILD) material, which can be deposited by a deposition method, e.g., chemical vapor deposition (CVD). The insulator 222 can also be an ultra low-k dielectric material, a carbon doped insulator material or other insulator material with porosity, or the like.

Figure 18:
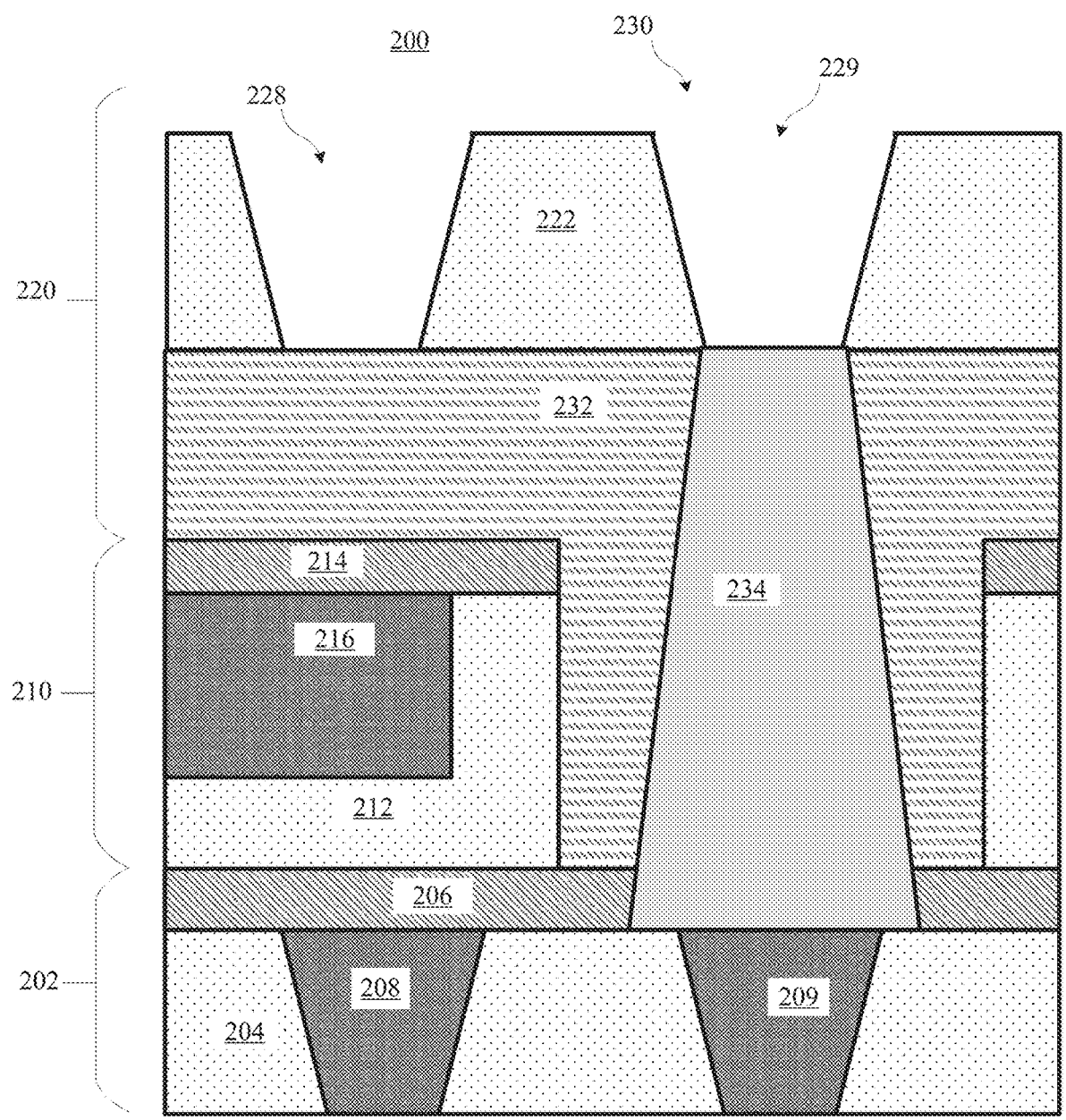

FIG. 18 depicts a cross-sectional view of semiconductor device 200 that includes the subtractive skip via 230 at a subsequent fabrication stage, according to embodiments of the disclosure. At the present fabrication stage, the higher $M_c$ level 220 is further formed by forming wiring trenches 228, 229 and via interconnect trenches (not shown) within insulator 222.

Figure 19:
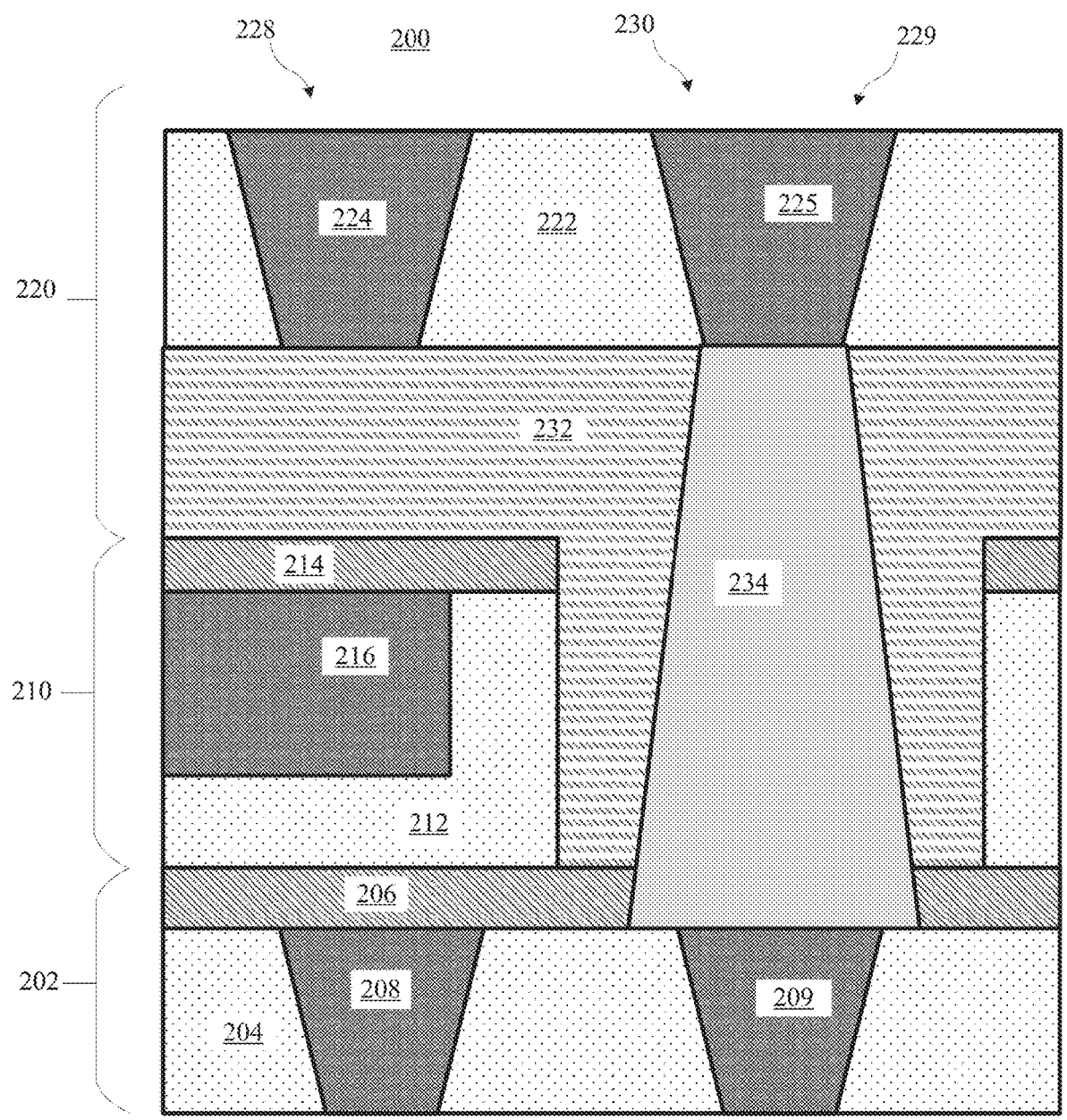

The wiring trenches 228, 229 can be formed by lithography, etching, and deposition methods. For example, a resist formed over the insulator 222 is exposed to energy (light) to form a pattern (opening). An etching process with a selective chemistry, e.g., reactive ion etching (RIE), will be used to form one or more trenches in the insulator 222 through the openings of the resist. The etching process can be timed or may otherwise stop at a depth in which a surface (e.g., top surface) of the conductive skip via 234 is exposed by the wiring trench 229. In this way, the subtractive skip via 230 will be at a height which lands on or contacts the wiring structure 125 in the $M_c$ level 220, as depicted in FIG. 19. In an example, the dielectric backfill 232 may serve as an etch stop in forming one or more of the wiring trenches 228, 229. Subsequent to forming the wiring trenches 228, 229, the resist and/or mask may be removed by stripants and/or etchants.

FIG. 19 depicts a cross-sectional view of semiconductor device 200 that includes the subtractive skip via 230 at a subsequent fabrication stage, according to embodiments of the disclosure. At the present fabrication stage, the higher $M_c$ level 220 is further formed by forming wiring structures 224, 225 within wiring trenches 228, 229, respectively. Further via interconnect structures (not shown) may be formed within the via interconnect trenches (not shown) within insulator 222.

For clarity, the wiring structures 224, 225 may be upper wiring structures, designated at an M3, M4, etc. level; whereas the via interconnect structures (not shown) are upper via interconnect structures designated at V2, V3, etc. level. These via interconnect structures may connect the wiring structure 224 with the wiring structure 216, or the like.

The wiring structures 224, 225 and the via interconnect structures (not shown) can be formed using conventional lithography, etching, and deposition processes, similar to that which was discussed with respect to the formation of the wiring structures 208, 209. The wiring structures 224, 225 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc. For example, conductive material can be deposited in the one or more wiring trenches 228, 229 by any conventional deposition processes, e.g., chemical vapor deposition (CVD) processes. The wiring structures 208, 209 can be composed of any conductive material such as, e.g., copper, tungsten, cobalt, nickel, aluminum, ruthenium etc. In a particular implementation, the wiring structures 224, 225 are composed of copper. Any residual conductive material on the surface of the insulator 222 can be removed by conventional chemical mechanical polishing (CMP) processes.

Following the CMP process, a capping layer (not shown) may be deposited on the wiring structures 224, 225 and insulator 222. In embodiments, this capping layer can be similar to capping layers 206, 214, etc.

For clarity, embodiments of the disclosure include the subtractive skip via 230 that includes conductive skip via 234 that connects wiring structure 225 within $M_c$ level 220 with wiring structure 209 within $M_a$ wiring level 202 (e.g., subtractive skip via 230 does not contact a wiring structure in $M_b$ wiring level 210). The conductive skip via 234 is subtractively formed by removing portion(s) of a relatively larger metal fill 238. The sides of conductive skip via 234 are surrounded by dielectric backfill 232 which may be a different dielectric material relative to insulators 204, 212, 222, etc. and may be a different dielectric material relative to capping layers 206, 214, etc. Further, conductive skip via 234 may be a different conductive material or metal relative to wiring structure(s) 208, 209, 216, 224, and/or 225. Dielectric backfill 232 may increase subsequent etch selectivity control, such that wiring trench 229 formation may use the dielectric backfill 232 as an etch stop. In certain implementations, multiple subtractive skip vias 230 may be formed and may provide for relatively reduced pitch or spacing therebetween, relative to traditional skip via designs.

Figure 20:
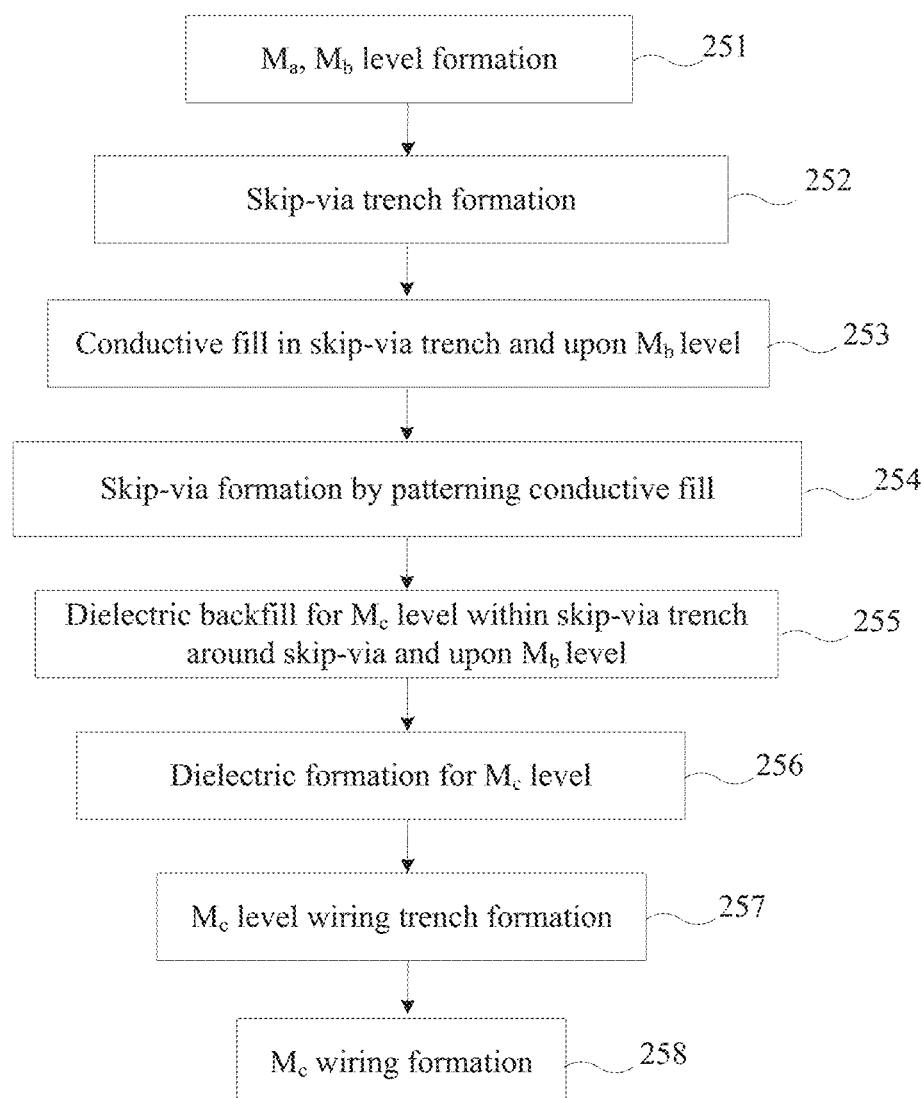
FIG. 20 depicts a method of fabricating a semiconductor device that includes a subtractive skip via, according to embodiments of the disclosure.

FIG. 20 depicts a method 250 of fabricating semiconductor device 200 that includes subtractive skip via 230, according to embodiments of the disclosure. Method 250 begins at block 251 with forming $M_a$ level 202 and with forming $M_b$ level 210. Method 250 continues at block 252 with forming skip via opening 236 within capping layer 214, within insulator 212, and within capping layer 206.

Method 250 may continue at block 253 with forming conductive fill 238 within the skip via opening 236 and may continue at block 254 by shaping or patterning the conductive fill 238 by removing portion(s) thereof while retaining and thereby forming conductive skip via 234. Method 250 may continue at block 255 with forming dielectric backfill 232 around the side perimeter of the forming conductive skip via 234 within the skip via opening 236, thereby forming subtractive skip via 230.

Method 250 may continue at block 256 with forming insulator 222 upon the subtractive skip via 230 and upon the dielectric backfill 232 within $M_c$ level 220, may continue at block 257 with forming wiring trench 229 within $M_c$ level 220, and may continue at block 258 with forming wiring structure 225 within wiring trench 229 within $M_c$ level 220.

Figure 21B:
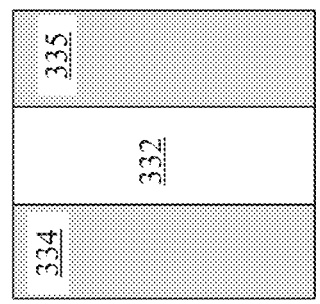
FIG. 21B depicts an orthogonal cross-sectional view of the subtractive skip via of FIG. 21A, according to embodiments of the disclosure.
Figure 21A:
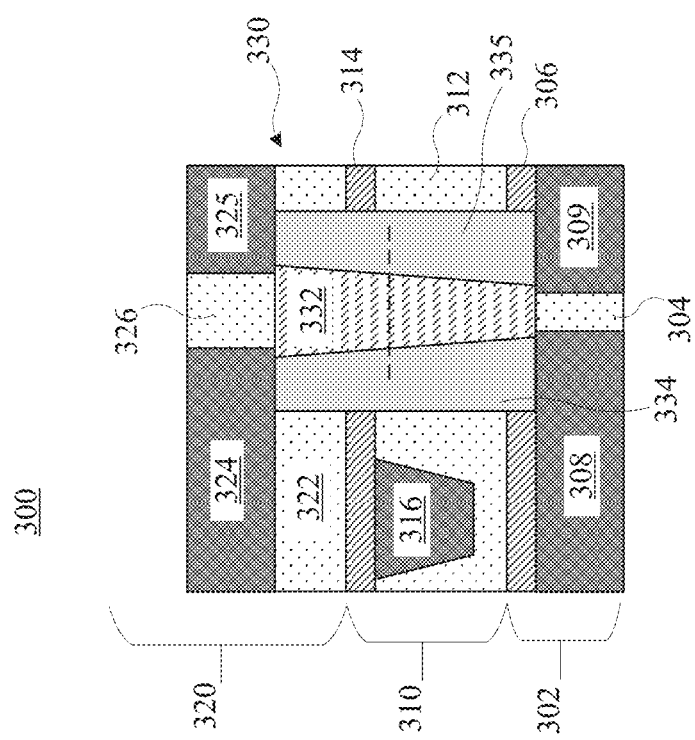
FIG. 21A depicts a cross-sectional view of a semiconductor device that includes a subtractive skip via, according to embodiments of the disclosure.

Referring now to FIG. 21A which depicts a cross-sectional view of a semiconductor device 300 that includes a dual subtractive skip via 330, according to embodiments of the disclosure.

In embodiments, the semiconductor device 300 can be a back end of the line (BEOL) or middle of the line (MOL) structure. In particular, the semiconductor device 300 includes a plurality of wiring levels, e.g., $M_a$ level 302, $M_b$ level 310, $M_c$ level 320, etc., in an IC device, such as a microprocessor, die, wafer, or the like. For example, the semiconductor device 300 includes wiring structures 308, 309 provided in an insulator 204 in $M_a$ level 302. For clarity, the wiring structures 308, 309 are lower wiring structures, designated representatively at a lower level (e.g., M0 level for BEOL), or CA/CB level for MOL, although the wiring structures 308, 309 can be provided at any lower level of the semiconductor device 300.

In embodiments, the insulator 304 is an oxide-based material, e.g., ILD material, which can be deposited by a deposition method, e.g., CVD, etc. The insulator 304 can also be an ultra low-k dielectric material, a carbon doped insulator material or other insulator material with porosity.

The wiring structures 308, 309 can be formed by lithography, etching, and deposition methods. For example, a resist formed over the insulator 304 is exposed to energy (light) to form a pattern (opening). An etching process with a selective chemistry, e.g., RIE, will be used to form one or more trenches in the insulator 304 through the openings of the resist. The resist can then be removed by a conventional oxygen ashing process or other known stripants. Following the resist removal, conductive material can be deposited in the one or more trenches by any conventional deposition processes, e.g., CVD processes. The wiring structures 308, 309 can be composed of any conductive material such as, e.g., copper, tungsten, cobalt, nickel, aluminum, ruthenium etc. In a particular implementation, the wiring structures 308, 309 are composed of copper. The wiring structures 308, 309 can also be lined with Ti, Ta, TiN, TaN, ruthenium, cobalt, etc. Any residual conductive material on the surface of the insulator 304 can be removed by conventional CMP processes.

Following the CMP process, a capping layer 306 is deposited on the wiring structures 308, 309 and insulator 304. In embodiments, the capping layer 306 can be a diffusion barrier layer, e.g., copper diffusion barrier layer, which prevents copper or other metallization diffusion to an insulator 312 as well as preventing oxygen diffusion to the wiring structures 308, 309.

Next, a higher $M_b$ level 310 is formed. $M_b$ level 310 may be formed with similar techniques relative to the $M_a$ level 302 and may include wiring structure 316 and via interconnect structures (not shown) within the insulator 312. In embodiments, the wiring structure 316 and the via interconnect structures can be formed in any wiring layer above that of the wiring structures 308, 309.

For clarity, the wiring structure 316 may be upper wiring structures, designated at an M2, M3, etc. level; whereas the via interconnect structures (not shown) are upper via interconnect structures designated at V1, V2, etc. level. These via interconnect structures may connect the wiring structure 316 with the wiring structure 308, or the like.

The wiring structure 316 and the via interconnect structures (not shown) can be formed using conventional lithography, etching, and deposition processes, similar to that which was discussed with respect to the formation of the wiring structures 308, 309. The wiring structure 316 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 312, a capping layer 314 is formed on the wiring structure 316 and insulator 312. In embodiments, the capping layer 314 can be a diffusion barrier layer, e.g., copper diffusion barrier layer, as described above, the insulator 312 can be any insulator material as described above.

Next, a skip via opening exposes a portion of the wiring structure 309 and a portion of the wiring structure 308. A conductive material may fill the skip via opening and may be subsequently patterned or shaped. Undesired portions of the metal fill may be removed and a retained portions thereof forms a first conductive skip via 334 and a second conductive skip via 335. After the first conductive skip via 334 and a second conductive skip via 335 are formed, the dielectric backfill 232 may be formed therebetween. The dielectric backfill 232 material and geometry may be selected to reduce shorting propensities between the first conductive skip via 234 and the wiring structures the first conductive skip via 234 is not intended to be connected and between the second conductive skip via 235 and the wiring structures the second conductive skip via 235 is not intended to be connected. In certain implementations, the dual subtractive skip via 330 may provide for reduced skip via to skip via pitch or spacing relative to traditional skip via integrations.

For clarity, the dual subtractive skip via 330 does not contact with any wiring structure $M_b$ level 310 and thereby skips at least the $M_b$ level 310, as depicted. The dual subtractive skip via 330 includes a dual skip via of the first conductive skip via 234 and the second conductive skip via 235 separated by dielectric backfill 332.

Next, one or more additional portions of $M_c$ level 320 are formed. $M_c$ level 320 may be formed with similar techniques relative to the below level(s) and may include wiring structures 324, 325 and via interconnect structures (not shown) within an insulator 322. In embodiments, the wiring structures 324, 325 and the via interconnect structures can be formed in any wiring layer above that of the wiring structure 316.

For clarity, the wiring structures 324, 325 may be upper wiring structures, designated at an M2, M3, etc. level; whereas the via interconnect structures (not shown) are upper via interconnect structures designated at V1, V2, etc. level. These via interconnect structures may connect the wiring structure 324 with the wiring structure 316, or the like. In a particular example, wiring structures 308, 309 are in a M1 wiring level, wiring structure 316 is in a M2 wiring level, and wiring structures 324, 325 are in a M3 wiring level.

The wiring structures 324, 325 and the via interconnect structures (not shown) can be formed using conventional lithography, etching, and deposition processes, similar to that which was discussed with respect to the formation of the wiring structures 308, 309, and/or 316. The wiring structures 324, 325 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 322, a capping layer (not shown) may be formed on the wiring structures 324, 325 and insulator 322. In embodiments, the capping layer (not shown) can be a diffusion barrier layer, e.g., copper diffusion barrier layer, as described above, the insulator 322 can be any insulator material as described above.

FIG. 21B depict an orthogonal cross-sectional view of the dual subtractive skip via 330, according to embodiments of the disclosure. For example, the dielectric backfill 332 may adequately physically and electrically separate the first conductive skip via 334 and the second conductive skip via 335.

The orthogonal cross-sectional plane of FIG. 21B is depicted as a dashed line through the dual subtractive skip via 330 in FIG. 21A.

Figure 22:
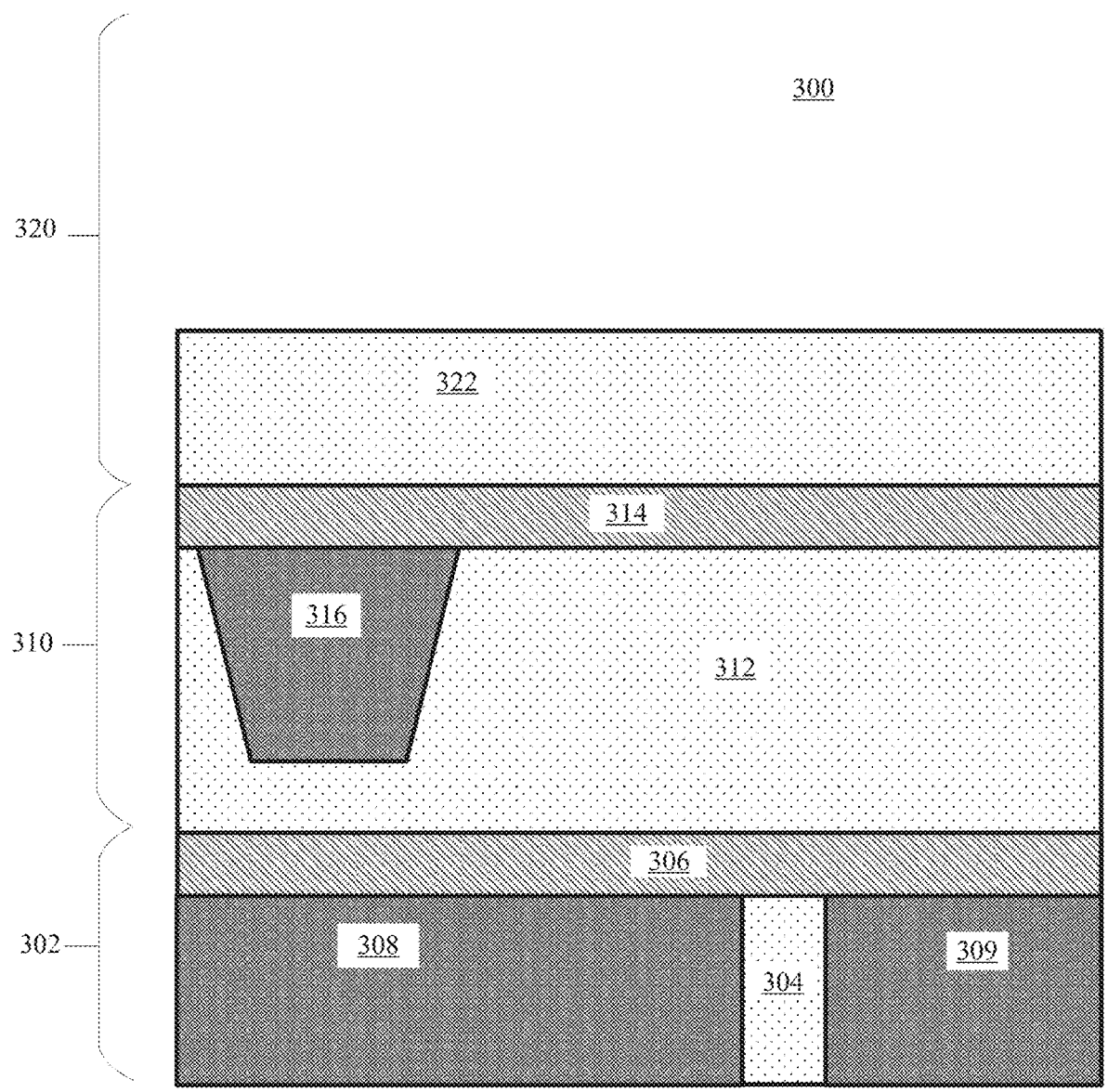
FIG. 22 through FIG. 28 depicts cross-sectional views of a semiconductor device that includes a subtractive skip via at stages of the semiconductor device fabrication process, according to embodiments of the disclosure.
Figure 23:
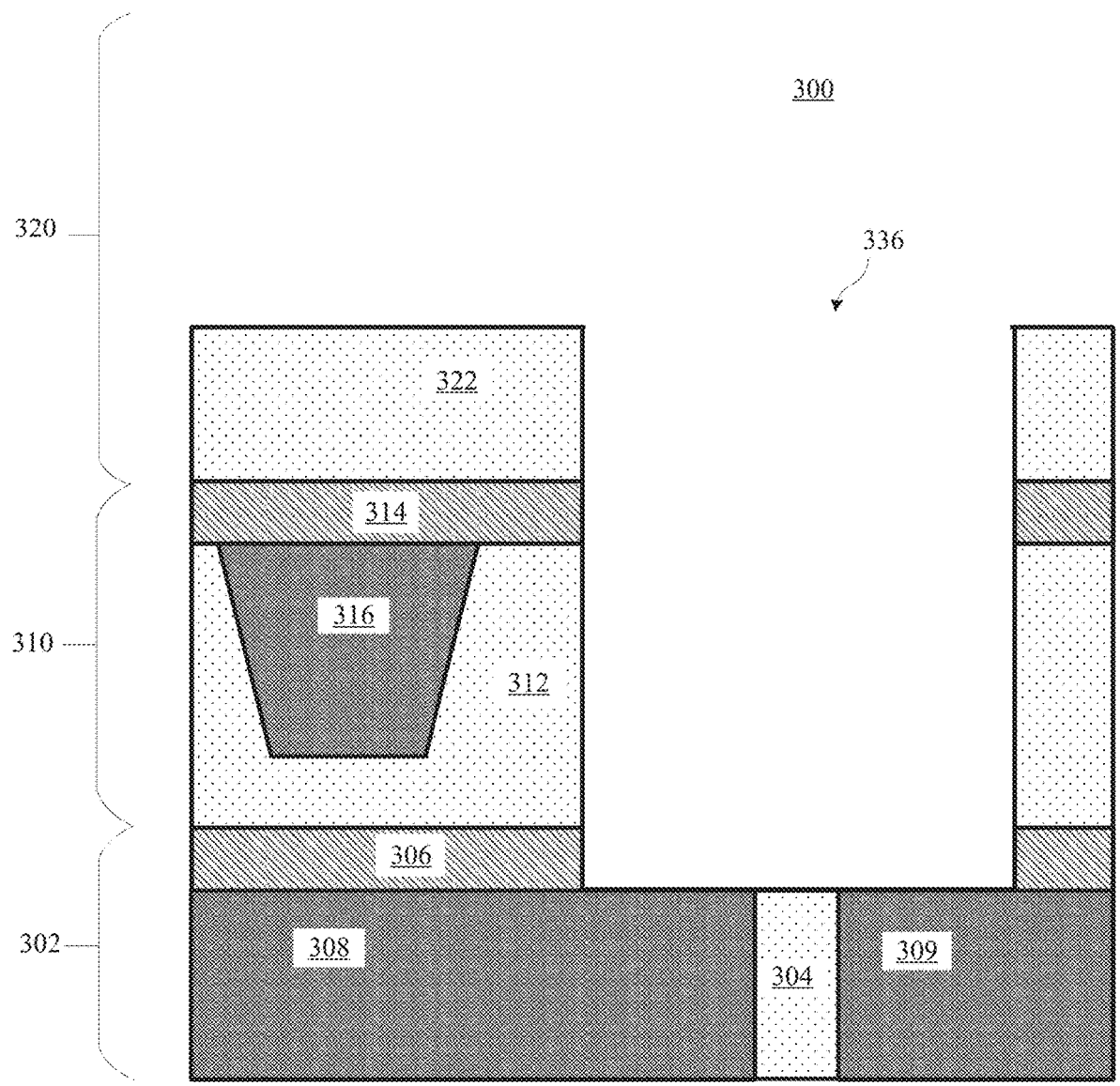

FIG. 22 depicts a cross-sectional view of semiconductor device 300 that is to include the dual subtractive skip via 330 at an initial fabrication stage, according to embodiments of the disclosure.

Initially $M_a$ level 302 is formed upon an underlying IC device layer (not shown), such as a microprocessor layer, die layer, wafer layer, or the like. For example, insulator 304 is formed upon a device level, such as front end of the line (FEOL) layer, MOL layer, or the like. The insulator may be formed by depositing the oxide, ultra low-k dielectric, carbon doped insulator material, or other insulator material with porosity, or the like, upon the underlying IC device layer (not shown).

Wiring structures 308, 309 may be formed in the insulator 304. The wiring structures 308, 309 can be formed by lithography, etching, and deposition methods. For example, a resist (not shown) formed over the insulator 304 is exposed to energy (e.g., light, etc.) to form a pattern (opening). An etching process with a selective chemistry, e.g., reactive ion etching (RIE), may be used to form one or more trenches in the insulator 304 through the openings of the resist. Such etching technique may result in sloped sidewalls, such that the width of the top of the trenches are greater than the width of the bottom of the trenches, as depicted. The resist can then be removed by a conventional oxygen ashing process or other known stripants.

Following the resist removal, wiring structures 308, 309 may be further fabricated by depositing conductive material in the one or more trenches by a deposition process, e.g., chemical vapor deposition (CVD) process, or the like. The wiring structures 308, 309 can be composed of any conductive material such as, e.g., copper, tungsten, cobalt, nickel, aluminum, ruthenium etc. In a particular implementation, the wiring structures 308, 309 are composed of copper. The wiring structures 308, 309 can also be lined with Ti, Ta, TiN, TaN, ruthenium, cobalt, etc. Any residual conductive material on the surface of the insulator 304 can be removed by a chemical mechanical polishing (CMP) process.

Following the CMP process, a capping layer 306 is deposited on the wiring structures 308, 309 and insulator 304. In embodiments, the capping layer 306 can be a diffusion barrier layer, e.g., copper diffusion barrier layer, which prevents copper or other metallization diffusion to an insulator 312 as well as preventing oxygen diffusion to the wiring structures 308, 309.

Next, the $M_b$ level 310 is formed. $M_b$ level 310 may be formed with similar techniques relative to the $M_a$ level 302 and may include wiring structure 316 and via interconnect structures (not shown) within the insulator 312. In embodiments, the wiring structure 316 and the via interconnect structures can be formed in any wiring layer above that of the wiring structures 308, 309.

For clarity, the wiring structure 316 may be an upper or higher wiring structure, designated at an M1, M2, etc. level; whereas the via interconnect structures (not shown) are upper via interconnect structures designated at V0, V1, etc. level. These via interconnect structures may connect the wiring structure 316 with the wiring structure 308, or the like.

The wiring structure 316 and the via interconnect structures (not shown) can be formed using conventional lithography, etching, and deposition processes, similar to that which was discussed with respect to the formation of the wiring structures 308, 309. The wiring structure 316 and the via interconnect structures (not shown) can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator 312, a capping layer 314 is formed on the wiring structure 316 and insulator 312. In embodiments, the capping layer 314 can be a diffusion barrier layer, e.g., copper diffusion barrier layer, as described above, the insulator 312 can be any insulator material as described above. Next, a first portion of $M_c$ level 320 is formed. $M_c$ level 320 may be partially formed by depositing a first insulator 322 upon the capping layer 114.

FIG. 13 depicts a cross-sectional view of semiconductor device 300 that is to include the dual subtractive skip via 330 at a subsequent fabrication stage, according to embodiments of the disclosure. At the present fabrication stage, a skip via opening 336 is formed within capping layer 314, within insulator 312, and within capping layer 306.

The skip via opening 336 can be formed using lithography and etching processes. For example, a masking material (not shown) is formed on the surface of insulator 322. The masking material is patterned by lithography processes, e.g., a resist is formed on the masking material, which is exposed to energy (light) to form a pattern (openings) in alignment with a desired location or region of the dual subtractive skip via 330. Such location or region, as exemplary defined by the perimeter of the dual subtractive skip via 330 of FIG. 21B, has sufficient side to side dimension and/or front to rear dimension in relation to the depth of the skip via opening 336 for the skip via opening 336 to have a low aspect ratio, as previously described.

An etching process, such as an antitropic etch, dry etch, wet etch, RIE, or the like, may be used to form the skip via opening 336 in the insulator 322, in the capping layer 314, in the insulator 312, and in the capping layer 306 through the openings of the resist. The etch may result in substantially vertical skip via opening 336 sidewalls. The etching process can be timed or may otherwise stop at a depth in which a surface (e.g., top surface) of the wiring structure 309 and in which a surface of the wiring structure 308 is exposed by the skip via opening 336. In this way, the dual subtractive skip via 330 will be at a depth which lands on or contacts the exposed surfaces of the wiring structures 308, 309 in the $M_a$ level 302. Subsequent to forming the skip via opening 336, the resist and/or mask may be removed by stripants and/or etchants.

Figure 24:
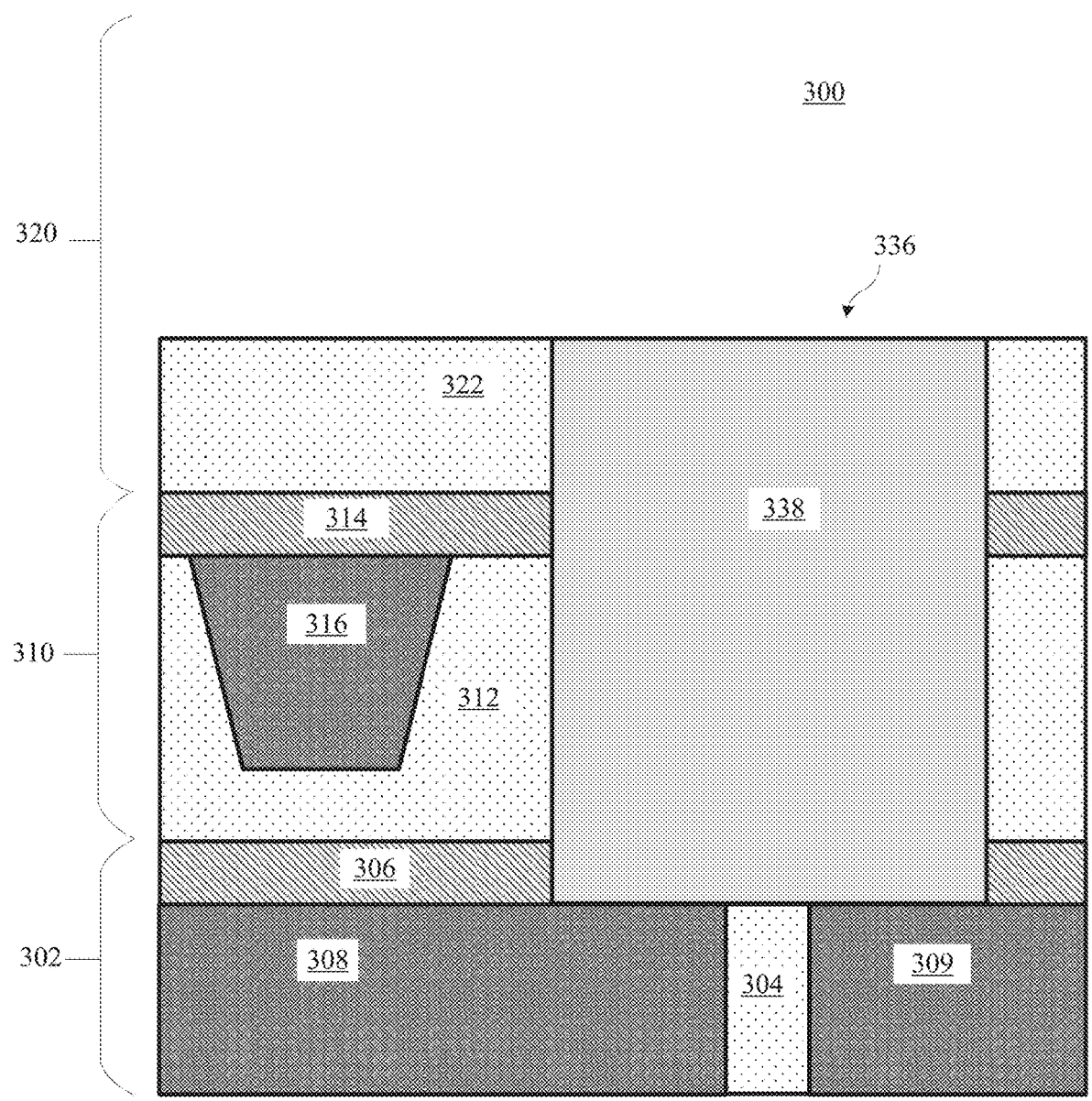

FIG. 24 depicts a cross-sectional view of semiconductor device 300 that is to include the dual subtractive skip via 330 at a subsequent fabrication stage, according to embodiments of the disclosure. At the present fabrication stage, a conductive fill 338 is formed within skip via opening 336.

The conductive fill 338 may consist of an electrically conductive material, such as a metal and may be a relative different metal relative to the wiring structures 308, 309, 312, or the like within the associated levels. The conductive fill 338 may consist of any conductive material such as, e.g., copper, cobalt, nickel, tungsten, aluminum, ruthenium etc., lined with Ti, Ta, TiN, TaN, ruthenium, cobalt, etc. In a particular example, conductive fill 338 may consist of ruthenium. A CMP process may remove any residual conductive fill 338 material from the surface of the insulator 322. For clarity, the conductive fill 338 lands on or contacts the exposed surface or surfaces of the wiring structure 308, 309, respectively, in the $M_a$ level 302.

Figure 25:
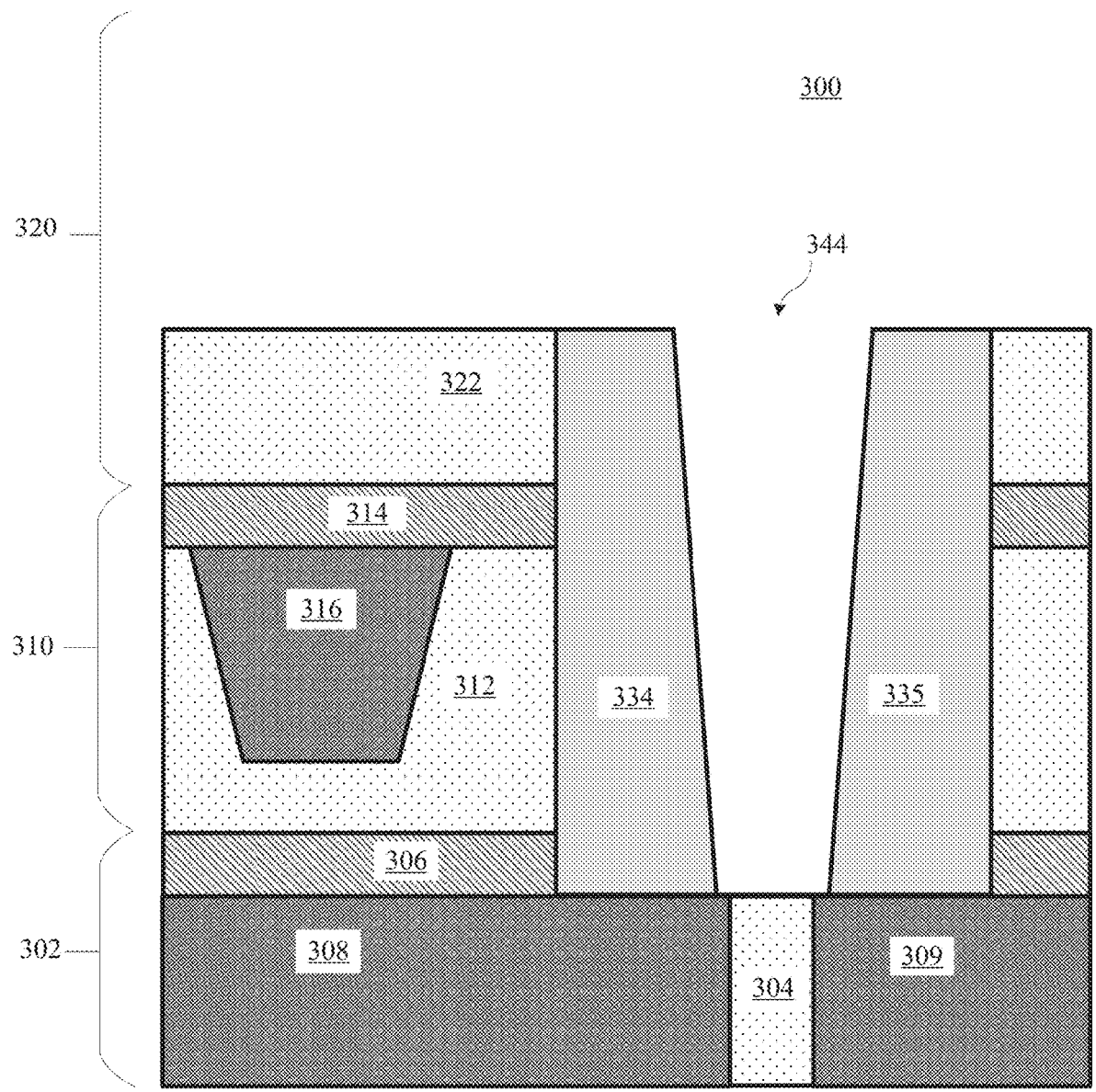

FIG. 25 depicts a cross-sectional view of semiconductor device 300 that is to include the dual subtractive skip via 330 at a subsequent fabrication stage, according to embodiments of the disclosure. At the present fabrication stage, conductive fill 338 is shaped by removing portion(s) thereof while the conductive fill 338 that remains forms the first conductive skip via 334 and forms the first conductive skip via 335.

The conductive skip vias 334, 335 can be formed using lithography and etching processes. For example, a masking material (not shown) is formed on the surface of the conductive fill 338. The masking material is patterned by lithography processes, e.g., a resist is formed on the masking material, which is exposed to energy (light) to form a pattern (openings) in vertical alignment with a desired central region of the dual subtractive skip via 330. Such location or region may effectively split the dual subtractive skip via 330 as shown in FIG. 21B.

An etching process, such as an etch, dry etch, wet etch, RIE, or the like, may be used to form the conductive skip vias 334, 335 by removing perimeter portion(s) conductive fill 338 through the openings of the resist. The etch may result in respective substantially sloped conductive skip via 334 and skip via 335 sidewalls. Respective, opposing sidewalls may be substantially vertical, as depicted, due to the etch properties of the skip via opening 336. For example, an upper section of conductive skip via 334 may have smaller width, or the like relative to a lower section of conductive skip via 334, an upper section of conductive skip via 335 may have smaller width, or the like relative to a lower section of conductive skip via 335. The etching process can be selective to the material of conductive fill 338, such that the material of conductive fill 338 is removed while the insulator 304, capping layer 306, insulator 312, capping layer 314, and insulator 322, etc. remains. For clarity, because conductive skip vias 334, 335 are formed by removing portion(s) of a relatively larger volume conductive fill 338, conductive skip via 334 and conductive skip via 335 are considered in this disclosure as a subtractive conductive skip via. Likewise, the resulting associated dual subtractive skip via 330 is considered a subtractive skip via.

The conductive skip vias 334, 335 has a relatively HAR compared to the skip via opening 336 in which conductive skip vias 334, 335 are formed. In an example, the conductive skip vias 334, 335 together may have an aspect ratio in which the height or depth of the conductive skip vias 334, 335 together is more than twice their combined width (e.g., left to right, back to front, etc.). Similarly, the conductive skip vias 334, 335 together may have an aspect ratio in which the height or depth of the conductive skip vias 334, 335 together is less than ten times their combined width.

For clarity, a portion of an upper surface of insulator 304 within the skip via opening 336 may be exposed by the shaping of conductive fill 338, as depicted. Because portion (s) of conductive fill 338 within the skip via opening 336 are removed, a reformed skip via opening 344 may be resultantly formed. The reformed skip via opening 344 may be bounded between the facing internal sidewalls of conductive skip vias 334, 335 and between the top surface of insulator 322 and the top surface of insulator 304. Subsequent to forming the conductive skip vias 334, 335, the resist and/or mask may be removed by stripants and/or etchants.

Figure 26:
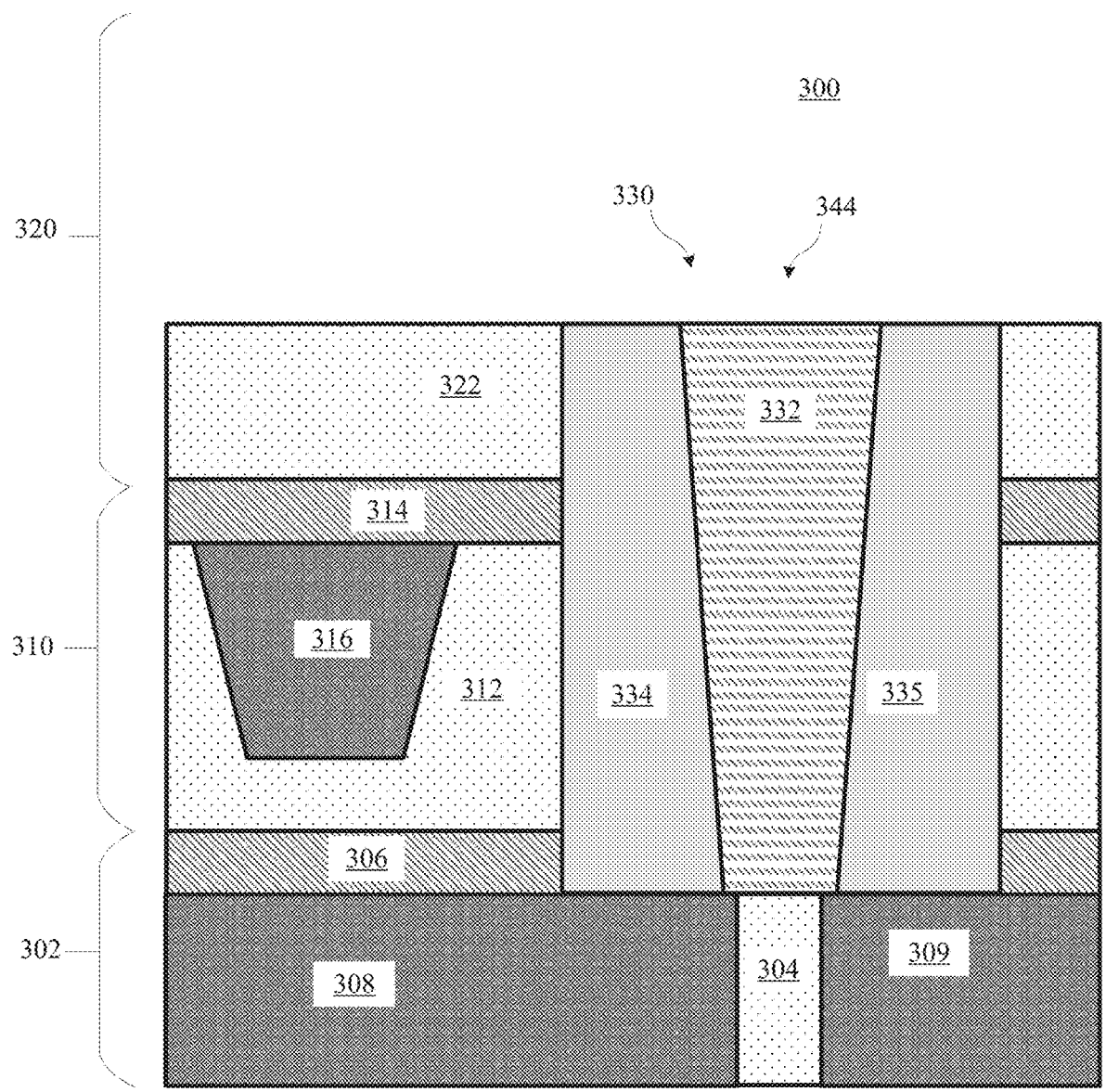

FIG. 26 depicts a cross-sectional view of semiconductor device 300 that is to include the dual subtractive skip via 330 at a subsequent fabrication stage, according to embodiments of the disclosure. At the present fabrication stage, dual subtractive skip via 330 is formed by depositing dielectric backfill 332 between conductive skip via 334 and conductive skip via 335 within the reformed skip via opening 344 and upon the insulator 304.

Dielectric backfill 332 may be formed upon the insulator 304 and between conductive skip via 334 and conductive skip via 335 within the reformed skip via opening 344. In other words, dielectric backfill 332 may be formed as a blanket layer. Dielectric backfill 332 may be formed by depositing a dielectric material such as SiBCN, SiOCN, SiCO, SiCOH, etc. In an example, the material of dielectric backfill 332 is different than the materials of the insulator layers and different than the capping layers. The dielectric material of dielectric backfill 332 and/or geometry of skip via opening 336 may be selected to reduce the propensity of electrical shorting between the conductive skip via 334 and wiring structures 309, 316 and selected to reduce the propensity of electrical shorting between the conductive skip via 335 and wiring structure 309, etc. Any residual dielectric material of dielectric backfill 332 on the surface conductive skip vias 334, 335 can be removed by a chemical mechanical polishing (CMP) process.

Figure 27:
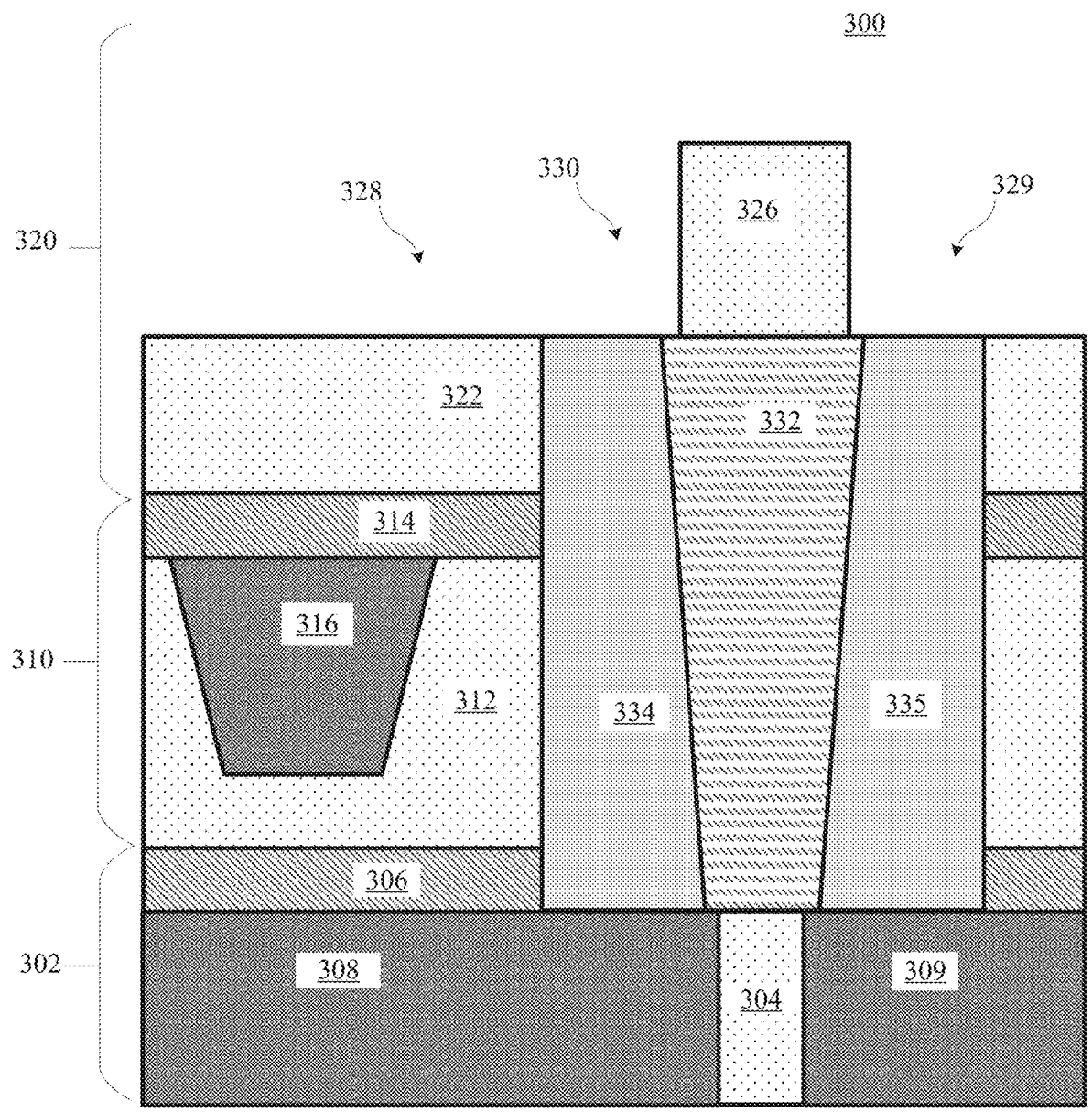

FIG. 27 depicts a cross-sectional view of semiconductor device 300 that includes the dual subtractive skip via 330 at a subsequent fabrication stage, according to embodiments of the disclosure. At the present fabrication stage, the $M_c$ level 330 is further formed by forming insulator 326 upon the dual subtractive skip via 330 and upon the insulator 322.

In embodiments, the insulator 326 is an oxide-based material (e.g., $SiO_2$ or the like), e.g., interlevel dielectric (ILD) material, which can be deposited by a deposition method, e.g., chemical vapor deposition (CVD). The insulator 326 can also be an ultra low-k dielectric material, a carbon doped insulator material or other insulator material with porosity, or the like.

The $M_c$ level 330 is further formed by forming wiring trenches 328, 329 and via interconnect trenches (not shown) within insulator 326.

Figure 28:
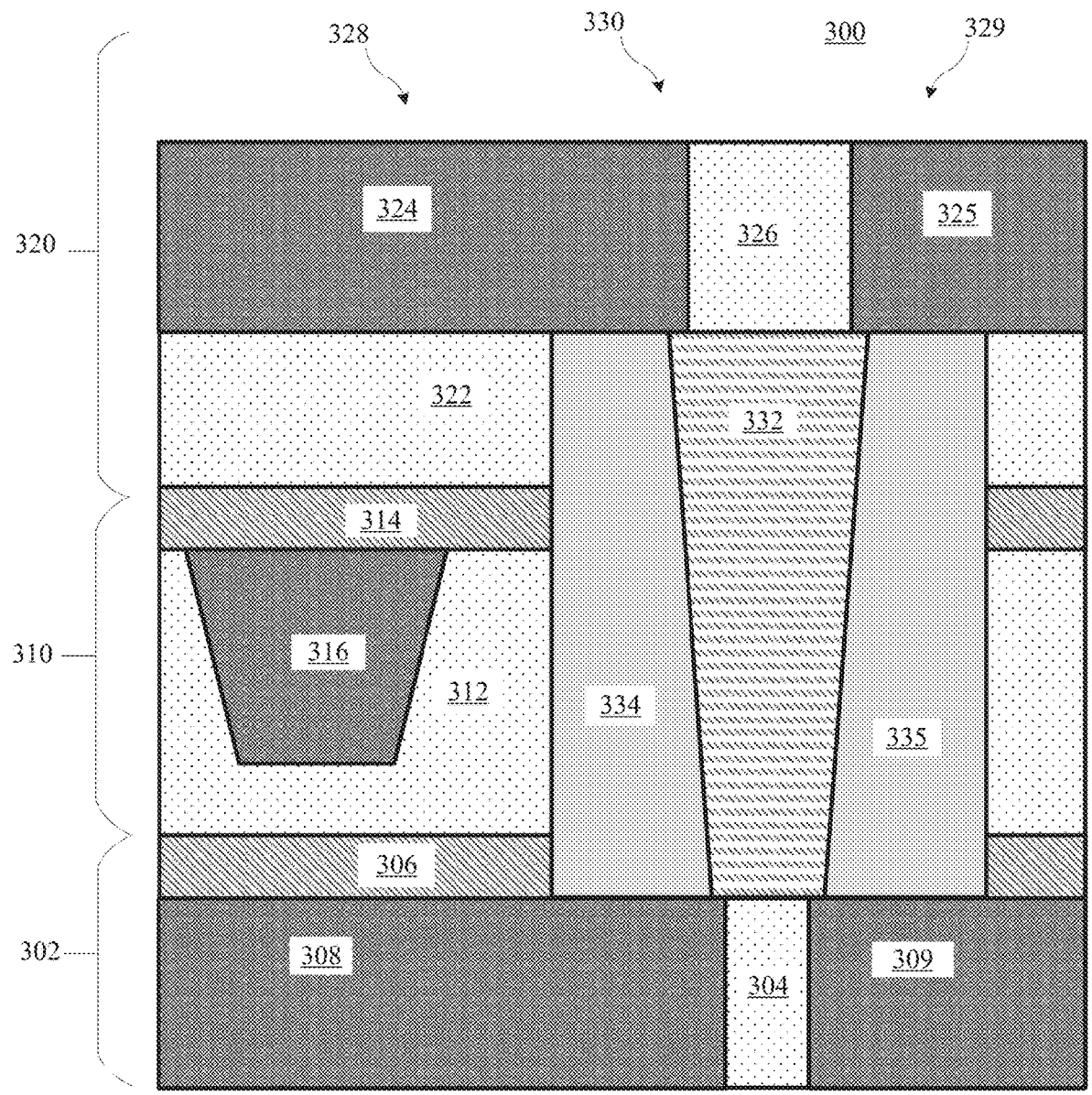

The wiring trenches 328, 329 can be formed by lithography, etching, and deposition methods. For example, a resist formed over the insulator 326 is exposed to energy (light) to form a pattern (opening). An etching process with a selective chemistry, e.g., reactive ion etching (RIE), will be used to form one or more trenches in the insulator 326 through the openings of the resist. The etching process can be timed or may otherwise stop at a depth in which a surface (e.g., top surface) of the conductive skip vias 334 is exposed by the wiring trench 328 and/or in which a surface (e.g., top surface) of the conductive skip vias 335 is exposed by the wiring trench 329. In this way, the subtractive skip via 330 will be at a height which lands on or contacts the wiring structure 324, 325 in the $M_c$ level 330, as depicted in FIG. 28. In an example, dielectric backfill 332 may be used as an etch stop in forming wiring trenches 328, 329. Subsequent to forming the wiring trenches 328, 329, the resist and/or mask may be removed by stripants and/or etchants.

FIG. 28 depicts a cross-sectional view of semiconductor device 300 that includes the dual subtractive skip via 330 at a subsequent fabrication stage, according to embodiments of the disclosure. At the present fabrication stage, the higher $M_c$ level 330 is further formed by forming wiring structures 324, 325 within wiring trenches 328, 329, respectively.

For clarity, the wiring structures 324, 325 may be upper wiring structures, designated at an M3, M4, etc. level. The wiring structures 324, 325 can be formed using conventional lithography, etching, and deposition processes, similar to that which was discussed with respect to the formation of the wiring structures 308, 309. The wiring structures 324, 325 can be composed of any conductive material such as, e.g., copper, cobalt, nickel, tungsten, aluminum, ruthenium etc., lined with Ti, Ta, TiN, TaN, ruthenium, cobalt, etc. For example, conductive material can be deposited in the one or more wiring trenches 328, 329 by any conventional deposition processes, e.g., chemical vapor deposition (CVD) processes. The wiring structures 308, 309 can be composed of any conductive material such as, e.g., copper, tungsten, cobalt, nickel, aluminum, ruthenium etc. In a particular implementation, the wiring structures 324, 325 are composed of copper. Any residual conductive material on the surface of the insulator 326 can be removed by conventional chemical mechanical polishing (CMP) processes.

Following the CMP process, a capping layer (not shown) may be deposited on the wiring structures 324, 325 and insulator 326. In embodiments, this capping layer can be similar to capping layers 306, 314, etc.

For clarity, embodiments of the disclosure include the dual subtractive skip via 330 that includes conductive skip via 334 that connects wiring structure 324 within $M_c$ level 330 with wiring structure 308 within $M_a$ wiring level 302 and that includes conductive skip via 335 that connects wiring structure 325 within $M_c$ level 330 with wiring structure 309 within $M_a$ wiring level 302 (e.g., dual subtractive skip via 330 does not contact a wiring structure in $M_b$ wiring level 310). The conductive skip vias 334, 335 are subtractively formed by removing portion(s) of a relatively larger metal fill 338. One or more sides of conductive skip vias 334, 335 are surrounded by dielectric backfill 332 which may be a different dielectric material relative to insulators 304, 312, 322, etc. and may be a different dielectric material relative to capping layers 306, 314, etc. The dielectric backfill 332 adequately physically and electrically separates conductive skip vias 334, 335.

Further, conductive skip vias 334, 335 may be a different conductive material or metal relative to wiring structure(s) 308, 309, 316, 324, and/or 325. Dielectric backfill 332 may increase subsequent etch selectivity control, such that wiring trench 328, 329 formation may use the dielectric backfill 332 as an etch stop. In certain implementations, multiple subtractive skip vias 330 may be formed and may provide for relatively reduced pitch or spacing therebetween, relative to traditional skip via designs.

Figure 29:
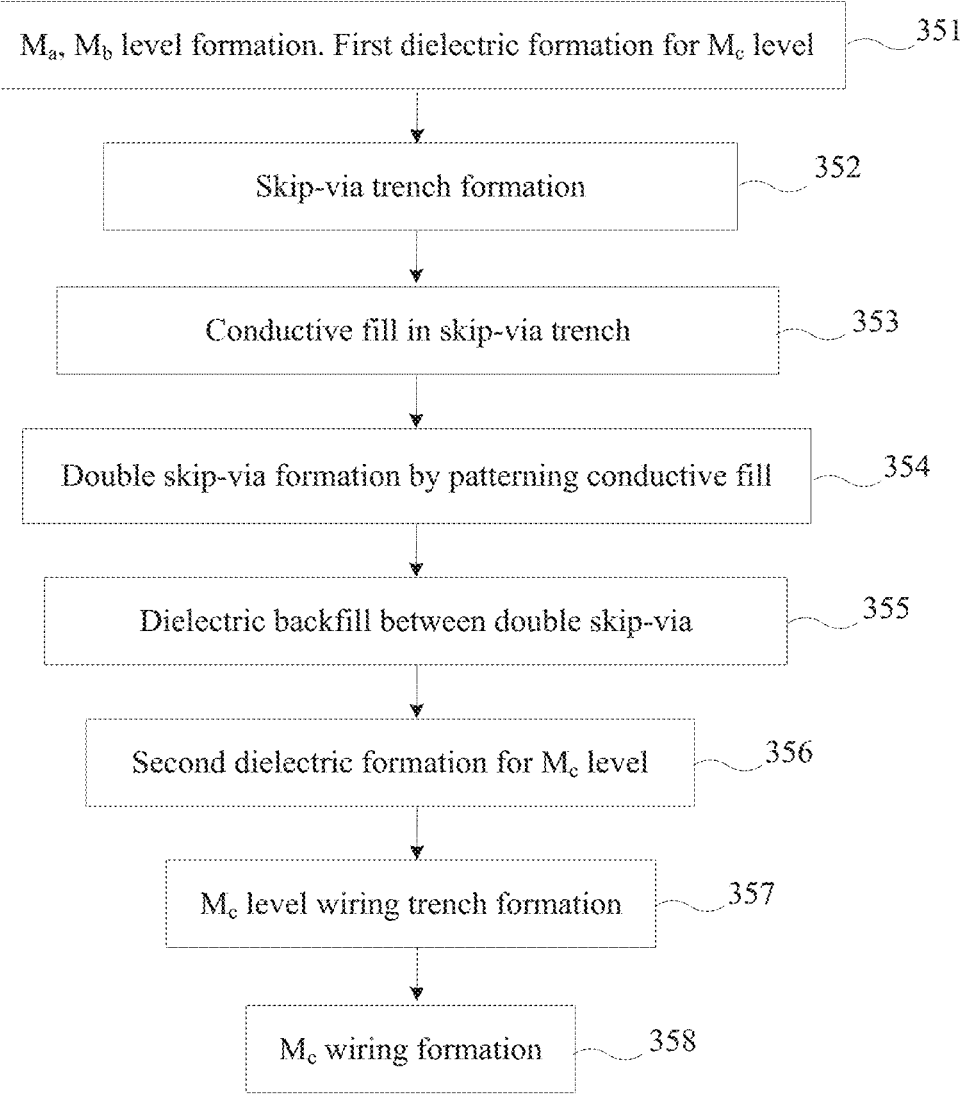
FIG. 29 depicts a method of fabricating a semiconductor device that includes a subtractive skip via, according to embodiments of the disclosure.

FIG. 29 depicts a method 350 of fabricating semiconductor device 300 that includes dual subtractive skip via 330, according to embodiments of the disclosure. Method 350 begins at block 351 with forming $M_a$ level 302, with forming $M_b$ level 310, and with partially forming $M_c$ level 320. Method 350 continues at block 352 with forming skip via opening 336 within insulator 322, within capping layer 314, within insulator 312, and within capping layer 306.

Method 350 may continue at block 353 with forming conductive fill 338 within the skip via opening 336 and may continue at block 354 by shaping or patterning the conductive fill 338 by removing portion(s) thereof while retaining and thereby forming conductive skip vias 334, 335. Method 350 may continue at block 355 with forming dielectric backfill 332 between conductive skip via 334 and conductive skip via 335 within the skip via opening 336, thereby forming dual subtractive skip via 330.

Method 350 may continue at block 356 with forming insulator 326 upon the dual subtractive skip via 330 and upon the dielectric backfill 332 within $M_c$ level 330, may continue at block 357 with forming wiring trenches 328, 329 within insulator 326 in $M_c$ level 330, and may continue at block 358 with forming wiring structure 324, and 325 within wiring trenches 328, 329, respectively, within $M_c$ level 330.

The descriptions of the various embodiments have been presented for purposes of illustration and are not intended to be exhaustive or limited to the embodiments disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
 a first wiring layer that includes a bottom wiring structure;
 a second wiring layer above the first wiring layer, the second wiring layer comprising a second wiring layer insulator;
 a third wiring layer above the second wiring layer, the third wiring layer comprising a top wiring structure within a third wiring layer insulator;
 a subtractive skip via that connects the bottom wiring structure and the top wiring structure; and
 a dielectric fill around a side perimeter of the subtractive skip via wherein a top surface of the dielectric fill is above a bottom surface of the third wiring layer insulator so that the dielectric fill extends into the third wiring layer.

2. The semiconductor device of claim 1, wherein the dielectric fill is a different material relative to the second wiring layer insulator.

3. The semiconductor device of claim 2, wherein the dielectric fill is a different material relative to the third wiring layer insulator.

4. The semiconductor device of claim 1, wherein the subtractive skip via is composed of a different metal relative to the bottom wiring structure.

5. The semiconductor device of claim 4, wherein the subtractive skip via is composed of a different metal relative to the top wiring structure.

6. The semiconductor device of claim 1, wherein a top width of the subtractive skip via is less than a bottom width of the subtractive skip via.

7. The semiconductor device of claim 1, wherein the dielectric fill has a low aspect ratio.

8. The semiconductor device of claim 7, wherein the subtractive skip via has a high aspect ratio.

9. The semiconductor device of claim 1, wherein the subtractive skip via is composed of ruthenium.

10. A semiconductor device comprising:
 a first wiring layer that includes a bottom wiring structure;
 a second wiring layer above the first wiring layer, the second wiring layer comprising a second wiring layer insulator;
 a third wiring layer above the second wiring layer, the third wiring layer comprising a top wiring structure within a third wiring layer insulator;
 a subtractive skip via that connects the bottom wiring structure and the top wiring structure; and
 a dielectric fill around a side perimeter of the subtractive skip via and between the second wiring layer insulator and the third wiring layer insulator.

11. The semiconductor device of claim 10, wherein the dielectric fill is a different material relative to the second wiring layer insulator.

12. The semiconductor device of claim 11, wherein the dielectric fill is a different material relative to the third wiring layer insulator.

13. The semiconductor device of claim 10, wherein the subtractive skip via is composed of a different metal relative to the bottom wiring structure.

14. The semiconductor device of claim 13, wherein the subtractive skip via is composed of a different metal relative to the top wiring structure.

15. The semiconductor device of claim 10, wherein a top width of the subtractive skip via is less than a bottom width of the subtractive skip via.

16. A semiconductor device comprising:
 a first wiring layer that includes a first bottom wiring structure and a second bottom wiring structure;
 a second wiring layer above the first wiring layer, the second wiring layer comprising a second wiring layer insulator;
 a third wiring layer above the second wiring layer, the third wiring layer comprising a third wiring layer insulator, a first top wiring structure within the third wiring layer insulator, and a second top wiring structure within the third wiring layer insulator;
 a dual subtractive skip via comprising a first subtractive skip via that connects the first bottom wiring structure and the first top wiring structure and a second subtractive skip via that connects the second bottom wiring structure and the second top wiring structure; and
 a dielectric fill between the first subtractive skip via and the second subtractive skip via.

17. The semiconductor device of claim 16, wherein the dielectric fill is a different material relative to the second wiring layer insulator.

18. The semiconductor device of claim 17, wherein the dielectric fill is a different material relative to the third wiring layer insulator.

19. The semiconductor device of claim 16, wherein the first subtractive skip via is composed of a different metal relative to the first top wiring structure and the first bottom wiring structure.

20. The semiconductor device of claim 17, wherein the second subtractive skip via is composed of a different metal relative to the second top wiring structure and the second bottom wiring structure.

* * * * *